(12) United States Patent
Adachi et al.

(10) Patent No.: US 9,280,455 B2
(45) Date of Patent: Mar. 8, 2016

(54) MEMORY CONTROL DEVICE, NON-VOLATILE MEMORY, AND MEMORY CONTROL METHOD

(71) Applicant: Sony Corporation, Tokyo (JP)

(72) Inventors: Naohiro Adachi, Tokyo (JP); Keiichi Tsutsui, Kanagawa (JP); Ken Ishii, Tokyo (JP); Hideaki Okubo, Saitama (JP); Kenichi Nakanishi, Tokyo (JP); Yasushi Fujinami, Tokyo (JP); Tatsuo Shinbashi, Tokyo (JP); Lui Sakai, Kanagawa (JP); Ryoji Ikegaya, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 278 days.

(21) Appl. No.: 13/945,987

(22) Filed: Jul. 19, 2013

(65) Prior Publication Data
US 2014/0059268 A1 Feb. 27, 2014

(30) Foreign Application Priority Data

Aug. 24, 2012 (JP) .................................. 2012-184742

(51) Int. Cl.
G06F 12/02 (2006.01)
G06F 12/00 (2006.01)
G11C 13/00 (2006.01)

(52) U.S. Cl.
CPC ............ G06F 12/00 (2013.01); G11C 13/0002 (2013.01); G11C 13/0064 (2013.01); G11C 13/0069 (2013.01); G11C 13/0097 (2013.01); G11C 2013/0073 (2013.01); G11C 2213/78 (2013.01)

(58) Field of Classification Search
CPC G06F 12/0246; G11C 13/002; G11C 13/004; G11C 13/0064; G11C 13/0097
See application file for complete search history.

(56) References Cited

U.S. PATENT DOCUMENTS

| 2006/0026489 A1* | 2/2006 | Noda et al. ..................... 714/768 |
| 2006/0080515 A1* | 4/2006 | Spiers et al. .................. 711/162 |
| 2010/0103723 A1* | 4/2010 | Kawai et al. .................. 365/163 |
| 2010/0131811 A1* | 5/2010 | Eto .............................. 714/721 |
| 2012/0002485 A1* | 1/2012 | Suwa et al. .............. 365/185.29 |
| 2014/0164682 A1* | 6/2014 | Lee et al. ...................... 711/103 |

OTHER PUBLICATIONS

K. Aratani, et al., "A Novel Resistance Memory with High Scalability and Nanosecond Switching," Technical Digest IEDM 2007, pp. 783-786.

* cited by examiner

Primary Examiner — Hiep Nguyen
(74) Attorney, Agent, or Firm — Hazuki International, LLC

(57) ABSTRACT

Provided is a memory control device, including a write control unit that sequentially designates a memory block, a write processing unit that writes write data in the designated memory block, a verifying unit that reads read data from the memory block and verifies whether or not the read data matches the write data for each of a plurality of memory cells, a retry inhibiting unit that inhibits a retry process from being performed in a memory cell in which the read data matches the write data among the plurality of memory cells, and a retry control unit that designates at least some memory blocks among the plurality of memory blocks and simultaneously executes the retry process when the read data does not match the write data in any one of the plurality of memory cells in which all the write data is written.

20 Claims, 22 Drawing Sheets

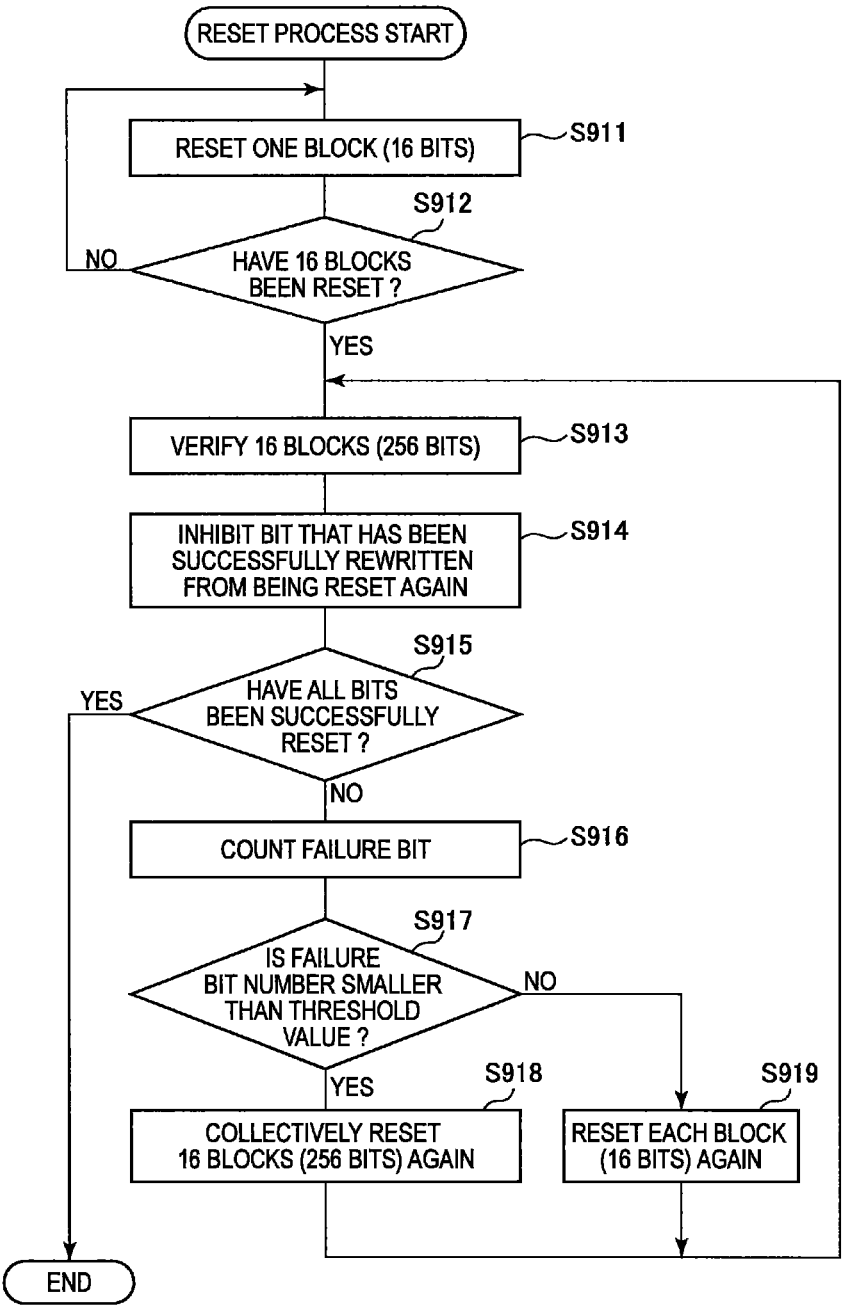

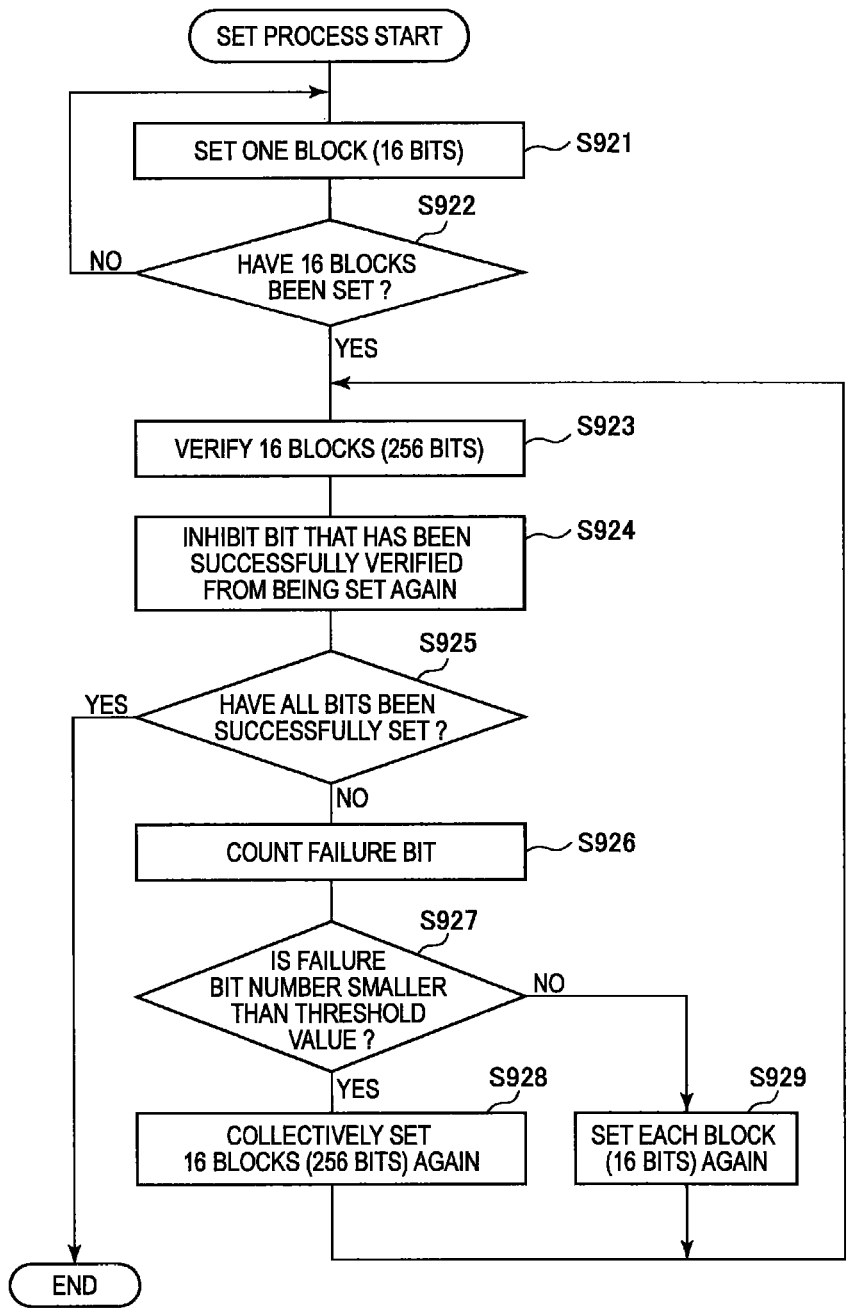

MEMORY CONTROL DEVICE, NON-VOLATILE MEMORY, AND MEMORY CONTROL METHOD

BACKGROUND

The present technology relates to a memory control device, a non-volatile memory, and a memory control method. Specifically, the present technology relates to a memory control device, a non-volatile memory, and a memory control method which are used to verify whether or not rewrite is successful.

In recent information processing systems, there are cases in which non-volatile memories (NVMs) are used as auxiliary storage devices or storages. The non-volatile memories are roughly divided into flash memories supporting data access using a large size as a unit and non-volatile random access memories (NVRAMs) capable of performing high-speed random access in small units. Here, as a representative example of a flash memory, there is a NAND flash memory.

Meanwhile, as an example of a non-volatile random access memory, there are a resistive RAM (ReRAM) and the like. In addition, a phase-change RAM (PCRAM), a magnetoresistive RAM (MRAM), and the like are known. Particularly, ReRAMs are capable of performing rewrite using a pulse having a short duration on the order of several nanoseconds (ns). For this reason, ReRAMs are attracting public attention as a non-volatile memory capable of performing a high-speed operation.

In a rewrite process of such a non-volatile memory, generally, a write process of rewriting data in a memory cell is executed, and then a verifying process of verifying whether or not an error has occurred at the time of rewrite is executed. Then, when an error has occurred, a retry process of performing rewrite again is executed. In the write process and the retry process, as the number of bits to be rewritten at the same time increases, an electric current necessary for rewrite increases. For example, in NOR (negative OR) flash memories, a rewrite current per bit is about 100 microamperes ($\mu A$). For this reason, when 8 bits are rewritten at the same time, an electric current of about 800 $\mu A$ is necessary. Further, execution times of the write process and the retry process correspond to the number of bits to be written at the same time. For example, when the rewrite speed at the time of rewriting 8 bits at the same time is about 1 microsecond ($\mu s$), about 8 seconds are necessary for each of the write process and the retry process of 256 bits.

The amount of an electric current that can be supplied at the time of rewrite is typically restricted by an electric current allowed in a current path and the capacity of a power supply. In this regard, a non-volatile memory in which a current path having a small voltage drop is secured to increase a suppliable current has been proposed as a result of conducting a study on connection of interconnections (for example, see K. Aratani, et al. "*A Novel Resistance Memory with High Scalability and Nanosecond Switching,*" Technical Digest IEDM 2007, pp 783-786).

SUMMARY

However, the above-mentioned related art has a problem in that it is difficult to improve the throughput of the rewrite process of the non-volatile memory. When an electric current allowed in a current path is increased, the amount of a suppliable electric current is restricted unless the capacity of a power supply increases. Therefore, there is a problem in that it is difficult to increase the number of rewrite bits to be equal to or more than the number of bits restricted by the capacity of a power supply at once, and it is difficult to improve the throughput.

It is desirable to improve the throughput of the rewrite process of a non-volatile memory.

According to a first embodiment of the present technology, there is provided a memory control device and a control method of the same, the control device including a write control unit that sequentially designates a memory block which is a data write unit in a plurality of memory cells, a write processing unit that writes write data in the designated memory block, a verifying unit that reads read data from the memory block in which the write data is written, and verifies whether or not the read data matches the write data for each of the plurality of memory cells, a retry inhibiting unit that inhibits a retry process of writing the write data again from being performed in a memory cell in which the read data matches the write data among the plurality of memory cells, and a retry control unit that designates at least some memory blocks among the plurality of memory blocks and simultaneously executes the retry process when the read data does not match the write data in any one of the plurality of memory cells in which all the write data is written. Thus, when the read data does not match the write data in one of the plurality of memory cells, at least some memory blocks are designated among the plurality of memory blocks, and the retry process is simultaneously executed.

Further, according to the first embodiment, the verifying unit may verify whether or not the read data matches the write data, and count a number of memory cells in which the read data does not match the write data as a failure bit number, and the retry control unit that designates at least some memory blocks among the plurality of memory blocks and simultaneously executes the retry process when the failure bit number is larger than 1 and the failure bit number is less than a predetermined threshold value. Thus, an effect in which, when the failure bit number is larger than 1 and the failure bit number is less than a predetermined threshold value, at least some memory blocks are designated among the plurality of memory blocks, and the retry process is simultaneously executed is obtained.

Further, according to the first embodiment, the retry control unit may sequentially designate the plurality of memory cells for each of the memory blocks and execute the retry process when the failure bit number is not less than the predetermined threshold value. Thus, an effect in which the plurality of memory cells are sequentially designated for each memory block, and the retry process is executed when the failure bit number is not less than the predetermined threshold value is obtained.

Further, according to the first embodiment, the predetermined threshold value may be a value that does not exceed a number of memory cells in which the write processing unit is allowed to write the write data at a same time.

Thus, an effect in which the predetermined threshold value does not exceed the number of memory cells in which the write processing unit is allowed to simultaneously write the write data is obtained.

Further, according to the first embodiment, the write processing unit may supply the write data to each of the memory cells in the designated memory block, and write the write data. The retry inhibiting unit may block supply of the data to the memory cell in which the read data matches the write data, and inhibits execution of the retry process. Thus, an effect in which supply of the data to a memory cell in which the read data matches the write data is blocked, and execution of the retry process is inhibited is obtained.

Further, according to the first embodiment, the retry control unit may designate all of the plurality of memory blocks and simultaneously execute the retry process when the read data does not match the write data in any one of the plurality of memory cells in which all the write data is written. Thus, when the read data does not match the write data in one of a plurality of memory cells, all of the memory blocks are designated, and the retry process is simultaneously executed.

Further, according to a second embodiment of the present technology, there is provided no n-volatile memory including a plurality of memory cells, a write control unit that sequentially designates a memory block which is a data write unit in the plurality of memory cells, a write processing unit that writes write data in the designated memory block, a verifying unit that reads read data from the memory block in which the write data is written, and verifies whether or not the read data matches the write data for each of the plurality of memory cells, a retry inhibiting unit that inhibits a retry process of writing the write data again from being performed in a memory cell in which the read data matches the write data among the plurality of memory cells, and a retry control unit that designates at least some memory blocks among the plurality of memory blocks and simultaneously executes the retry process when the read data does not match the write data in any one of the plurality of memory cells in which all the write data is written. Thus, when the read data does not match the write data in one of the plurality of memory cells, at least some memory blocks are designated among the plurality of memory blocks, and the retry process is simultaneously executed.

According to the embodiments of the present disclosure described above, there is an excellent effect by which the throughput of the rewrite process of a non-volatile memory is improved.

BRIEF DESCRIPTION OF THE DRAWINGS

FIG. 21 is a flowchart illustrating an example of a reset process according to the second embodiment; and FIG. 22 is a flowchart illustrating an example of a set process according to the second embodiment.

DETAILED DESCRIPTION OF THE EMBODIMENT(S)

Figure 1:
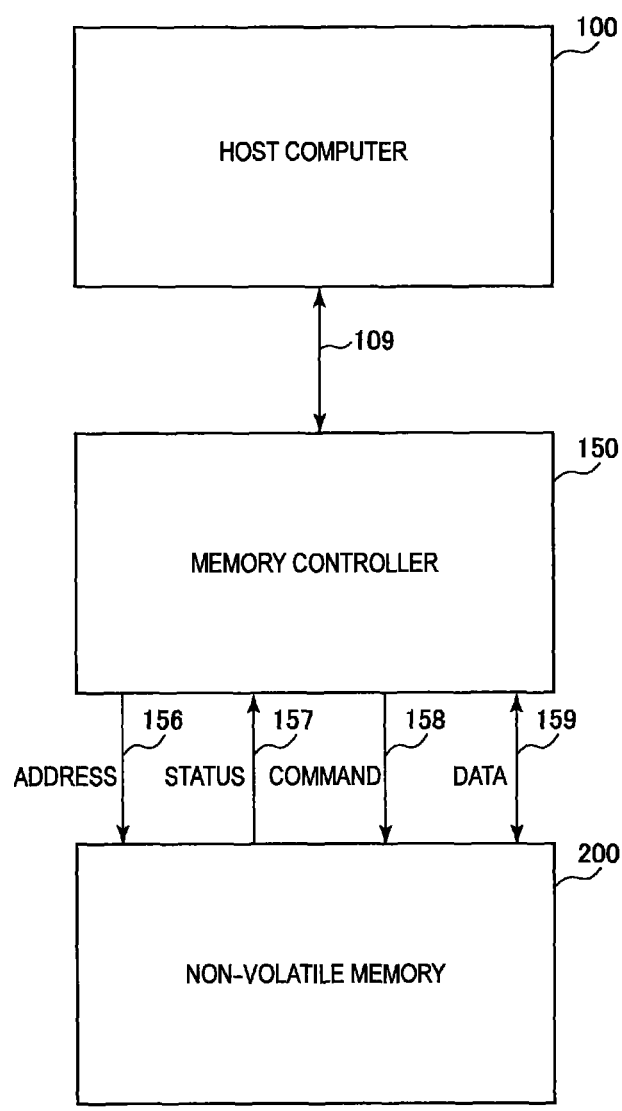
FIG. 1 is a block diagram illustrating an exemplary configuration of a memory system according to a first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, modes (hereinafter referred to as "embodiments") for carrying out the present technology will be described. The description will proceed in the following order.

1. First embodiment (example in which retry process is simultaneously executed in all memory blocks)

2. Second embodiment (example in which retry process is simultaneously executed in all memory blocks when failure bit number is less than threshold value)

1. First Embodiment

Exemplary Configuration of Memory System

FIG. 1 is a block diagram illustrating an exemplary configuration of a memory system according to an embodiment. The memory system includes a host computer 100, a memory controller 150, and a non-volatile memory 200.

The host computer 100 controls the memory system in general. Specifically, the host computer 100 generates a command, a logical address, and data, and supplies the command, the logical address, and the data to the memory controller 150 through a signal line 109. Further, the host computer 100 receives data and a status from the memory controller 150. Here, the command is used to control the memory system, and examples of the command include a write command used to instruct the data write process and a read command used to instruct the data read process. The logical address refers to an address in an address space defined by the host computer 100. The data refers to write data to be written in the non-volatile memory 200 or read data read from the non-volatile memory 200. The status is information used to notify of a command execution result or a status of the memory system.

The memory controller 150 controls the non-volatile memory 200. The memory controller 150 translates a logical address from the host computer 100 to a physical address, and supplies the physical address to the non-volatile memory 200 through a signal line 156. The physical address is an address allocated to a memory cell in the non-volatile memory 200.

The memory controller 150 receives the status from the non-volatile memory 200 through the signal line 157, updates the status as necessary, and supplies the updated status to the host computer 100.

The memory controller 150 analyzes the command received from the host computer 100, and supplies the command to the non-volatile memory 200 through a signal line 158. In addition, the memory controller 150 generates an error correcting code (ECC) on the write data received from the host computer 100. Further, the memory controller 150 supplies write data including an ECC to the non-volatile memory 200 through a signal line 159. Further, the memory controller 150 receives read data including an ECC from the non-volatile memory 200 through the signal line 159, performs detection and correction of an error in the read data based on the ECC, and supplies the resultant data to the host computer 100.

The non-volatile memory 200 stores data according to control of the memory controller 150. The non-volatile memory 200 receives a command, an address, and data from the memory controller 150. The non-volatile memory 200 writes data at a designated address when the command is the write command, and reads read data from a designated address when the command is the read command. Then, the non-volatile memory 200 generates a status, and supplies the generated status to the memory controller 150. Further, when read data is read, the non-volatile memory 200 supplies the read data to the memory controller 150.

Exemplary Configuration of Non-Volatile Memory

Figure 2:
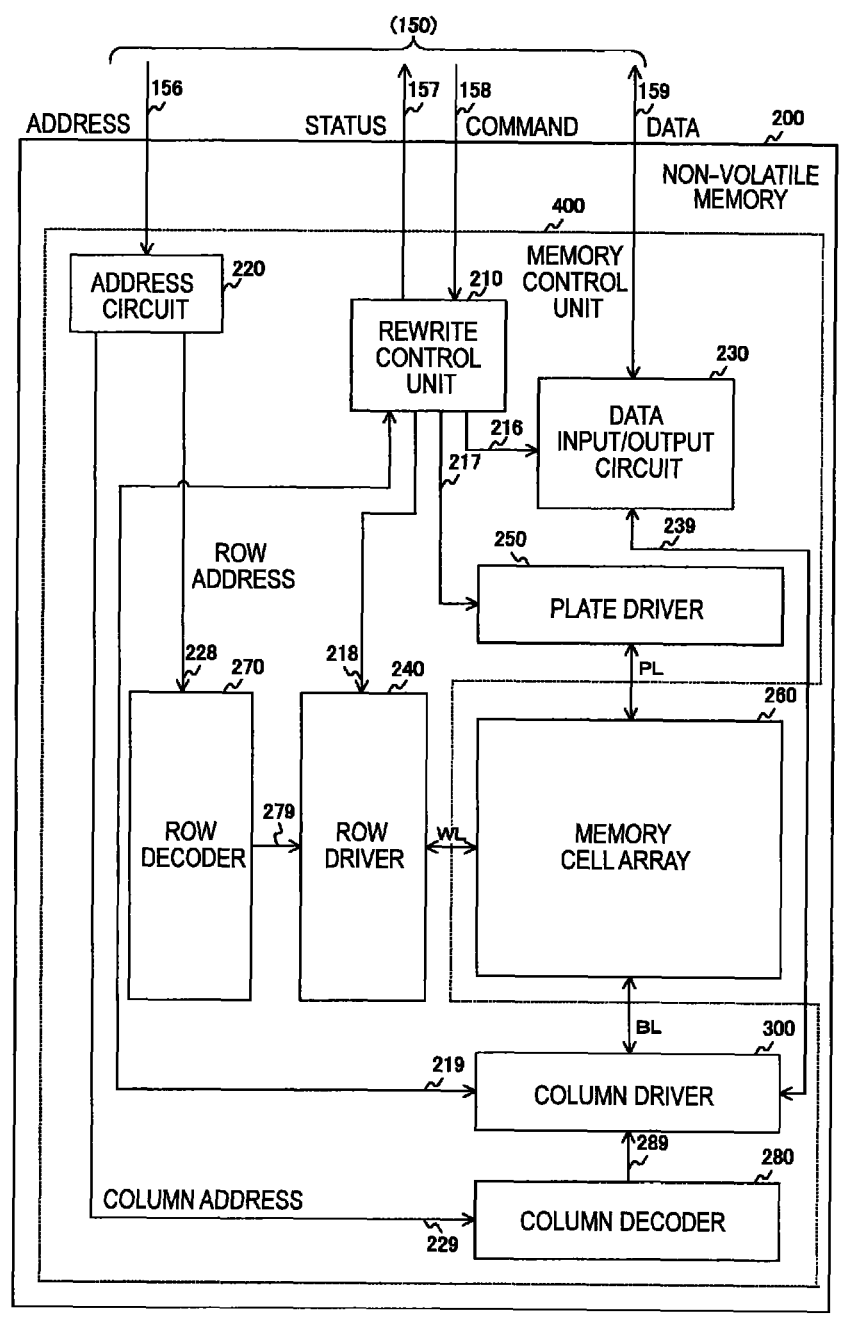
FIG. 2 is a block diagram illustrating an exemplary configuration of a non-volatile memory according to the first embodiment.

FIG. 2 is a block diagram illustrating an exemplary configuration of the non-volatile memory 200 according to a first embodiment. The non-volatile memory 200 includes a memory control unit 400 and a memory cell array 260. The memory control unit 400 includes a rewrite control unit 210, an address circuit 220, a data input/output circuit 230, a row driver 240, a plate driver 250, a row decoder 270, a column decoder 280, and a column driver 300. The memory control unit 400 is an example of a memory control device according to an embodiment of the present disclosure.

The rewrite control unit 210 receives a command from the memory controller 150, and controls the data input/output circuit 230, the row driver 240, the plate driver 250, and the column driver 300 according to the command. When the command is the read command, the rewrite control unit 210 supplies a control signal to instruct reading of read data to the plate driver 250, the row driver 240, and the column driver 300. Then, the rewrite control unit 210 receives a notification representing whether or not reading of read data from the column driver 300 has ended normally. When reading of read data has ended normally, the rewrite control unit 210 supplies a control signal for giving an instruction to output read data to the memory controller 150 to the data input/output circuit 230.

However, when the command is the write command, the rewrite control unit 210 supplies a control signal for giving a reset instruction to the plate driver 250, the row driver 240, and the column driver 300. The rewrite control unit 210 supplies an enable signal to the column driver 300. The enable signal will be described later.

Here, resetting is a process of rewriting a bit of "0," which is written in the memory cell, to "1." The resetting is also called "program."

The rewrite control unit 210 receives a verification result at the time of resetting from the column driver 300. Here, the verification result at the time of resetting is a verification result made by the column driver 300 representing whether or not "1" has been rewritten in all memory cells of a reset target by the resetting.

When "1" has not been rewritten in any one of the memory cells of the reset target, the rewrite control unit 210 supplies a control signal for giving a reset instruction again to the row driver 240, the plate driver 250, and the column driver 300. However, when "1" has been rewritten in all of the memory cells of the reset target, the rewrite control unit 210 supplies a control signal for giving a set instruction to the plate driver 250, the row driver 240, and the column driver 300.

Here, setting is a process of rewriting a bit of "1," which is written in the memory cell, to "0." The setting is also called "erasure."

Then, the rewrite control unit 210 receives a verification result at the time of setting from the column driver 300. Here, the verification result at the time of setting is a verification result made by the column driver 300 representing whether or not "0" has been rewritten in all memory cells of a set target by the setting.

When "0" has not been rewritten in any one of the memory cells of the set target, the rewrite control unit 210 supplies a control signal for giving a set instruction to the row driver 240, the plate driver 250, and the column driver 300 again. However, when "1" has been rewritten in all of the memory cells of the reset target, the rewrite control unit 210 determines that writing of write data has ended normally, and supplies a control signal for giving an instruction to erase held write data to the data input/output circuit 230. Further, the rewrite control unit 210 gives the instructions in the order of the reset instruction and the set instruction but may give the instructions in the order of the set instruction and the reset instruction.

Further, the rewrite control unit 210 generates the status representing the command execution result, and supplies the status to the memory controller 150.

The address circuit 220 divides the addresses received from the memory controller 150 into row addresses and column addresses. The row address designates a row of an access destination in the memory cell array 260. The column address designates a column of an access destination in the memory cell array 260.

The data input/output circuit 230 holds write data or read data according to control of the rewrite control unit 210. The data input/output circuit 230 receives read data from the column driver 300, and holds the read data. Then, when a read data output instruction is given by the rewrite control unit 210, the data input/output circuit 230 outputs the read data to the memory controller 150, and erases the read data. Further, the data input/output circuit 230 receives write data from the memory controller 150, and holds the write data. Then, the data input/output circuit 230 erases the held write data according to control of the rewrite control unit 210.

The plate driver 250 applies a plate voltage according to control of the rewrite control unit 210. The plate voltage is a voltage applied to a plate line PL in the memory cell array 260, and applied for the column driver 300 to access the memory cell array 260. An arrangement of the plate line PL in the memory cell array 260 will be described later. At the time of resetting, the plate driver 250 applies a plate voltage different from a plate voltage at the time of setting. For example, the plate driver 250 supplies a plate voltage lower than a voltage of the bit line BL at the time of resetting, and supplies a plate voltage higher than a voltage of the bit line BL. The bit line BL is a signal line arranged in the column direction in the memory cell array 260.

The row decoder 270 analyzes the row address received from the address circuit 220, and selects a word line WL corresponding to the row address. The word line WL is a signal line arranged in the row direction in the memory cell array 260.

The row driver 240 applies a voltage to the word line WL according to control of the rewrite control unit 210. When an instruction for one of reading, setting, and resetting is given, the row driver 240 applies a voltage of a high level to the word line WL selected by the row decoder 270 during a predetermined period of time, and applies a voltage of a low level to non-selected word lines WL.

A signal having a peak value as a write voltage applied to the word line WL is also called as a write pulse. The row driver 240 controls an applying timing and a duration of the write pulse and an applying voltage. Further, cell driving force based on a write pulse may be the same at each time of writing or may be variable. Further, a technique of controlling cell driving force is appropriate or inappropriate according to the type of a memory cell. For example, when a memory cell has a variable resistance type, there are a method of controlling an applying voltage, a method of causing a duration of a pulse to be constant and controlling the number of pulses, and a method of controlling a duration of a pulse as a method of changing cell driving force based on a write pulse. The row driver 240 may employ a control method based on a combination of the above-mentioned methods.

The column decoder 280 analyzes the column address received from the address circuit 220, and selects the bit line BL corresponding to the column address.

The column driver 300 applies a voltage to the bit line BL according to control of the rewrite control unit 210. When the read instruction is given by the rewrite control unit 210, the column driver 300 applies a voltage of a high level to the bit line BL selected by the column decoder 280, and applies a voltage of a low level to the non-selected bit lines BL. A memory cell of an access destination of the selected bit line BL is a memory cell of an access destination. Then, the column driver 300 reads data from a memory cell of an access destination, and supplies the data to the data input/output circuit 230 as read data through a signal line 239.

When the reset instruction is given by the rewrite control unit 210, the column driver 300 reads data from a memory cell of an access destination as pre-read data. The column driver 300 reads write data from the data input/output circuit 230, and compares the write data with the pre-read data in units of bits. The column driver 300 sets a memory cell corresponding to a bit in which the write data is "1" and the pre-read data is "0" as a reset target. The column driver 300 resets the memory cell of the reset target through the bit line BL. After the resetting, the column driver 300 verifies whether all memory cells of the reset target have been reset, and supplies the verification result to the rewrite control unit 210.

When the set instruction is given by the rewrite control unit 210, the column driver 300 compares the write data with the pre-read data in units of bits. The column driver 300 sets a memory cell of a bit in which the write data is "0" and the pre-read data is "1" as a set target. The column driver 300 sets the memory cell of the set target through the bit line BL. After the setting, the column driver 300 verifies that all the memory cells of the set target have been set, and supplies the verification result to the rewrite control unit 210.

The memory cell array 260 includes a plurality of memory cells arranged in the form of a matrix. For example, a ReRAM using a variable resistance element is used as each memory cell. Alternatively, a non-volatile memory element other than a ReRAM may be used as a memory cell. For example, a NAND flash memory cell of a floating gate (FG) type or a MONOS (metal-oxide-nitride-oxide-silicon) type may be used.

Exemplary Configuration of Memory Cell Array

Figure 3:
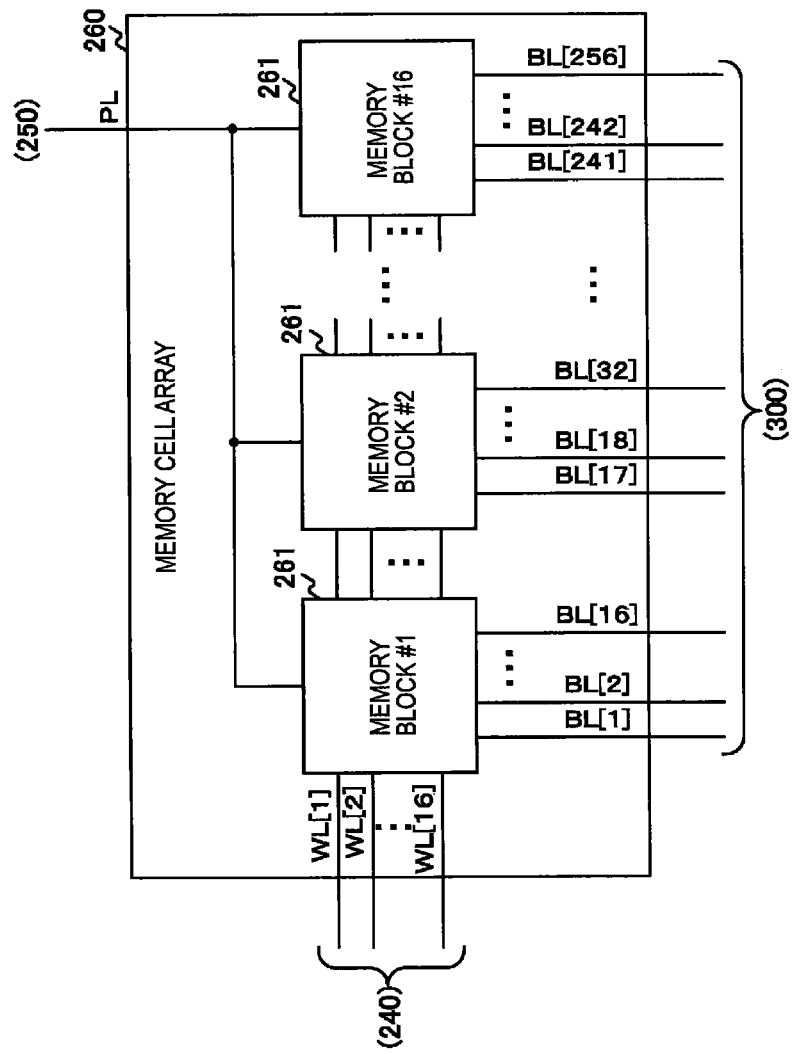
FIG. 3 is a block diagram illustrating an exemplary configuration of a memory cell array according to the first embodiment.

FIG. 3 is a block diagram illustrating an exemplary configuration of the memory cell array 260 according to the first embodiment. The memory cell array 260 includes a plurality of memory blocks 261. The memory block 261 represent each of regions obtained by dividing the memory cell array 260 into data write units. The write unit is decided according to the amount of an electric current that can be supplied to the memory cell array 260 by the memory control unit 400 at the time of data rewrite. When a rewrite current corresponding to a maximum of 18 bits can be supplied to the memory control unit 400 at once, the rewrite unit is 18 bits or less (for example, 16 bits).

For example, when the number of rows of memory cells arranged in the form of a matrix is 16, the number of columns is 256 and the write unit is 16 bits, 256 columns are divided into 16 and memory blocks #1 to #16 are disposed. As a result of division, 16×16 memory cells are arranged in each of the memory blocks #1 to #16. The plate line PL, the word line WL, and the bit line BL are connected to the memory cells. Since the number of rows and the number of columns of the memory cells of each of the memory blocks #1 to #16 are 16, 16 word lines WL and 16 bit lines BL are disposed in each of the memory blocks #1 to #16. The block division is imaginary and simply means that different addresses of memory cells are designated by the column driver 300. For this reason, the block division can be changed to any other aspect (the size of a block and the number of blocks) according to an address to be input to the column driver 300.

Exemplary Configuration of Memory Block

Figure 4:
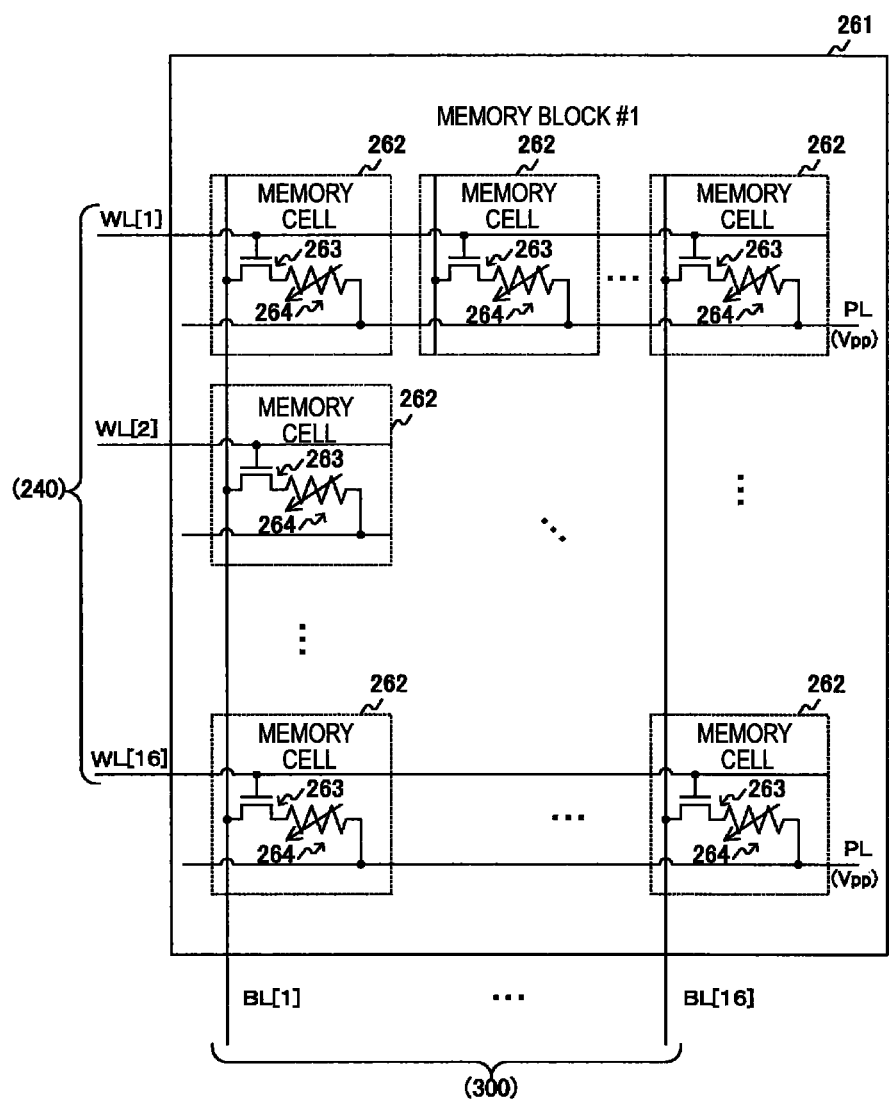
FIG. 4 is a circuit diagram illustrating an exemplary configuration of a memory block according to the first embodiment.

FIG. 4 is a circuit diagram illustrating an exemplary configuration of the memory block 261 according to the first embodiment. The memory block 261 includes 16×16 memory cells 262 arranged in the form of a 16×16 matrix. Each of the memory cells 262 includes an access transistor 263 and a variable resistor 264.

The access transistor 263 is a transistor controlling access to the memory cell 262 by the column driver 300. The access transistor 263 is formed on a semiconductor substrate, and includes two impurity regions configuring a source electrode and a drain electrode. A gate electrode is formed of polysilicon or the like above the substrate region of the impurity regions with a gate insulating film interposed therebetween. The gate electrode is connected to the word line WL, one of the source electrode and the drain electrode is connected to the bit line BL, and the other is connected to the variable resistor 264. When a voltage of a high level is applied to the word line WL corresponding to the row address, the access transistor 263 connected to the word line is in an ON state. Then, the column driver 300 can access the variable resistor 264 through the access transistor 263 in the ON state.

The variable resistor 264 is a resistor whose resistance value changes according to voltages respectively applied to the plate line PL and the bit line BL. The variable resistor 264 includes lower and upper electrodes and an insulating film and a conductor film interposed between the electrodes. The lower electrode is connected to the access transistor 263, and the upper electrode is connected to the plate line PL.

As a material of the insulating film, an insulating material such as SiN, $SiO_2$, or $Gd_2O_3$ is used. Examples of a material of the conductor film include a metallic film containing one or more metallic elements selected from Cu, Ag, and Al, an alloy film (for example, a CuTe alloy film), and a metallic compound film. Besides Cu, Ag, and Al, a metallic element having a characteristic that it is likely to be ionized may be used. The conductor film is formed as a "conductive ion supply film."

For example, when the voltage of the plate line PL is increased to be higher than the voltage of the bit line BL by a predetermined voltage or more, Cu, Ag, or Al included in the conductor film of the variable resistor 264 is ionized and has a property of being pulled to a cathode side. Then, the conductive ions of the metal are injected into the insulator film. For this reason, the insulator film is lowered in the insulation property and thus has conductivity. As described above, a state in which a resistance value is low transitions to, for example, a state in which a value of "1" is held.

Meanwhile, when the voltage of the plate line PL is increased to be higher than the voltage of the plate line PL by a predetermined voltage or more, conductive ions injected into the insulator film return to the conductor film, and thus a state in which the resistance value is high is caused. As described above, a state in which a resistance value is high transitions to, for example, a state in which a value of "0" is held. Further, a state in which a resistance value is low may be defined as a state in which a value of "0" is held, and a state in which a resistance value is high may be defined as a state in which a value of "1" is held.

Exemplary Configuration of Column Driver

Figure 5:
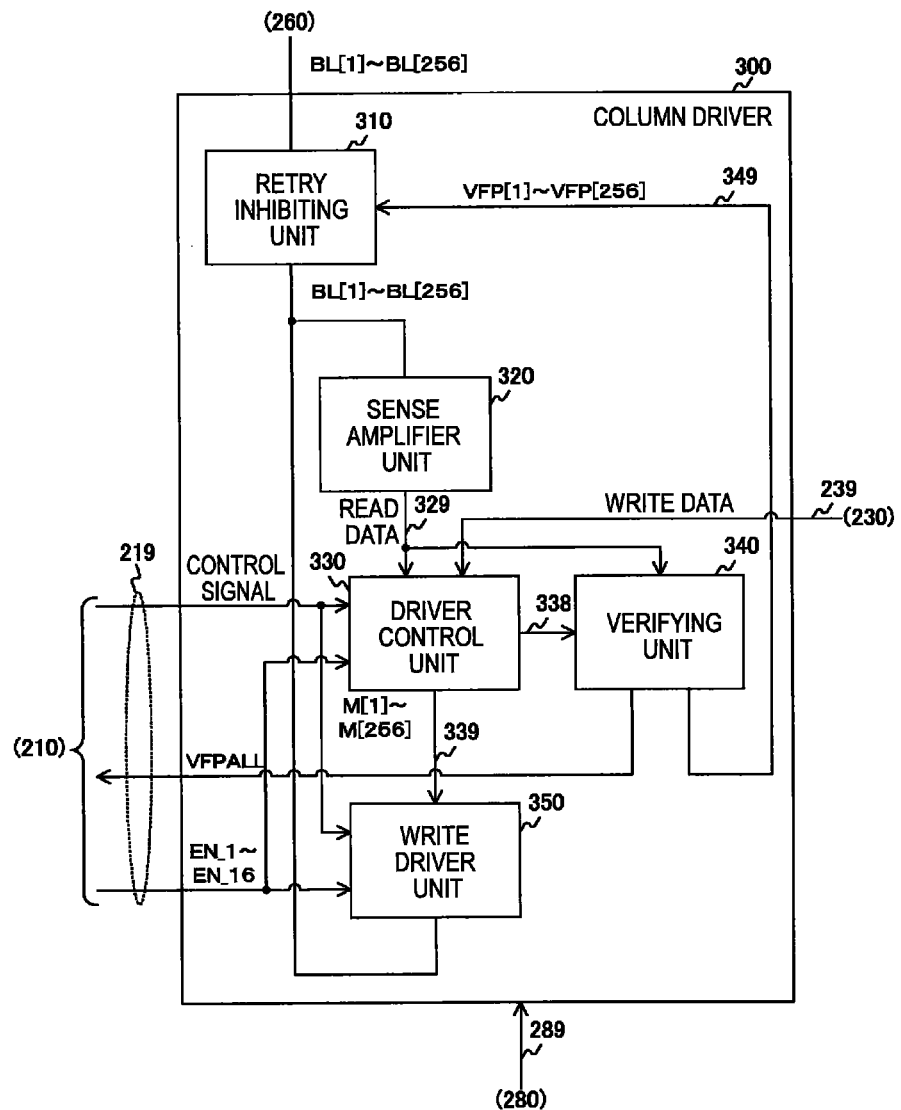
FIG. 5 is a block diagram illustrating an exemplary configuration of a column driver according to the first embodiment.

FIG. 5 is a block diagram illustrating an exemplary configuration of the column driver 300 according to the first embodiment. The column driver 300 includes a retry inhibiting unit 310, a sense amplifier unit 320, a driver control unit 330, a verifying unit 340, and a write driver unit 350.

The sense amplifier unit 320 amplifies the voltage of the bit line BL connected to a memory cell of an access destination. The sense amplifier unit 320 detects and amplifies the voltage of the bit line BL through the retry inhibiting unit 310. The sense amplifier unit 320 supplies data representing the amplified voltage to the driver control unit 330 and the verifying unit 340 as read data through a signal line 329.

The sense amplifier unit 320 includes at least one sense amplifier for each memory block. For example, the sense amplifier unit 320 includes the sense amplifier for each column. When the sense amplifier is provided for each column, the circuit size increases, and thus the sense amplifier unit 320 may be configured to include one sense amplifier for each memory block. In this case, a switch that switches a bit line of an access destination of the sense amplifier is disposed in the column driver 300, and the driver control unit 330 or the like is configured to control the switch.

The driver control unit 330 controls the write driver unit 350 such that a memory cell is set or reset. The driver control unit 330 receives the control signal for giving the reset or set instruction and enable signals EN_1 to EN_16 from the rewrite control unit 210. The enable signal EN_K (K is an integer of 1 to 16) is a signal representing a timing at which the memory cells of the memory block #K are collectively reset or set.

When the set instruction is given according to the control signal, the driver control unit 330 reads read data from the memory cell as pre-read data through the sense amplifier unit 320, reads write data from the data input/output circuit 230, and compares the read data with the write data in units of bits. The driver control unit 330 generates reset mask data RM[1] to RM[256] based on the comparison result, and supplies the reset mask data RM[1] to RM[256] to the write driver unit 350. The reset mask data represents that a bit which is reset in write data and set in pre-read data is reset, and the remaining bits are masked. For example, "0" is set to the reset mask data when a bit is a reset target, and "1" is set to the reset mask data otherwise.

Further, when all the memory blocks are reset by the enable signals EN_1 to EN_16, the driver control unit 330 sets a bit corresponding to a bit set in pre-read data in write data. The driver control unit 330 supplies the write data to the verifying unit 340 as write data WD[1] to WD[256] through a signal line 338.

Meanwhile, when the set instruction is given, the driver control unit 330 compares the pre-read data and the write data in units of bits. The driver control unit 330 generates set mask data SM[1] to SM[256] based on the comparison result, and supplies the set mask data SM[1] to SM[256] to the write driver unit. The set mask data represents that a bit which is set in write data and reset in pre-read data is set, and the remaining bits are masked. For example, "1" is set to the set mask data when a bit is a set target, and "0" is set to the set mask data otherwise. In FIG. 5, mask data M[1] to [256] includes the reset mask data RM[1] to RM[256] and the set mask data SM[1] to SM[256].

Further, when all the memory blocks are set, the driver control unit 330 supplies the write data WD[1] to WD[256] acquired from the data input/output circuit 230 to the verifying unit 340 through the signal line 338.

The write driver unit 350 sets or resets the memory cells according to control of the rewrite control unit 210 and the driver control unit 330. The write driver unit 350 receives the control signal for giving the reset or set instruction and the enable signals EN_1 to EN_16 from the rewrite control unit 210.

When the reset instruction is given according to the control signal, the enable signals EN_1 to EN_16 are sequentially set to the low level in order during a predetermined period of time. The write driver unit 350 resets all the memory cells in the memory block #K when the enable signal EN_K remains set to the low level. In this way, the memory blocks #1 to #16 are sequentially reset.

Meanwhile, when the set instruction is given according to the control signal, the enable signals EN_1 to EN_16 are sequentially set to the high level in order during a predetermined period of time. The write driver unit 350 sets all the memory cells in the memory block #K when the enable signal EN_K remains set to the high level. In this way, the memory blocks #1 to #16 are sequentially set.

Resetting or setting is sequentially performed in units of memory blocks as described above because there is a restriction to an electric current that can be supplied at once by the memory control unit 400.

Here, when the reset instruction is given according to the control signal again, the enable signals EN_1 to EN_16 are simultaneously set to the low level. Through this operation, the write driver unit 350 collectively resets a predetermined number of blocks in the memory blocks #1 to #16. Further, when the set instruction is given according to the control signal again, the enable signals EN_1 to EN_16 are simultaneously set to the high level. Through this operation, the write driver unit 350 collectively sets a predetermined number of blocks in the memory blocks #1 to #16. The process of performing resetting or setting again is hereinafter referred to as a "retry process." Here, the number of memory blocks collectively designated by the write driver unit 350 when setting or resetting is performed again is restricted by an electric current that can be supplied at once by the memory control unit 400, but it is desirable to collectively designate all the memory blocks. This is because the throughput is more improved when all the memory blocks are designated than when some of the memory blocks are designated. Hereinafter, the write driver unit 350 is assumed to collectively designate all the memory blocks.

As the retry process is performed collectively on the memory blocks as described above, compared to when the retry process is sequentially performed, a time of the retry process is reduced, and the throughput is improved. Here, even when the retry process is performed collectively on the memory blocks when setting or resetting is performed again, a possibility that more bits than bits allowed to be written at a time will be reset or set is low. The reason will be described later.

The write driver unit 350 is an example of a write processing unit according to an embodiment of the present disclosure.

The verifying unit 340 verifies whether or not all the memory cells of the reset target have been reset, and verifies whether or not all the memory cells of the set target have been set. Upon receiving write data from the driver control unit 330, the verifying unit 340 reads data from a memory cell of an access destination as verification read data through the sense amplifier unit 320. The verifying unit 340 compares the write data with the verification read data in units of bits. The verifying unit 340 generates verification results VFP[1] to VFP[256] based on the comparison result performed in units of bits, and supplies the verification results VFP[1] to VFP[256] to the retry inhibiting unit 310. For example, a value of "1" is set to the verification result VFP[k] when a k-th bit in the write data matches a k-th bit in the verification read data, and "0" is set to the verification result VFP[k] otherwise. Here, k is an integer of 1 to 256.

Further, the verifying unit 340 generates a signal representing that all bits of the write data match all bits of the verification read data as a verification result VFPALL, and supplies the verification result VFPALL to the rewrite control unit 210. For example, a value of "1" is set to the verification result VFPALL when all bits match, and "0" is set to the verification result VFPALL otherwise.

The retry inhibiting unit 310 prevents setting or resetting from being performed again in a memory cell in which the write data matches the verification read data, that is, a memory cell in which setting or resetting has been successfully performed. The details of a configuration of the retry inhibiting unit 310 will be described later.

As described above, resetting is prevented from being performed again in a memory cell in which resetting has been successfully performed, and a failure probability of resetting is low. Thus, when an instruction to perform resetting again is given, the number of bits that are actually reset is small. For example, if a failure probability of resetting is about 1 percent, when 256 bits are reset, 12 or 13 bits fail in resetting and are reset again. Since the number of bits to be reset again is small, even though the memory blocks are collectively reset when resetting is performed again, a possibility that more bits than bits (for example, 18 bits) allowed to be written at a time will be reset is low. This is similarly applied to setting.

Exemplary Configuration of Retry Inhibiting Unit

Figure 6:
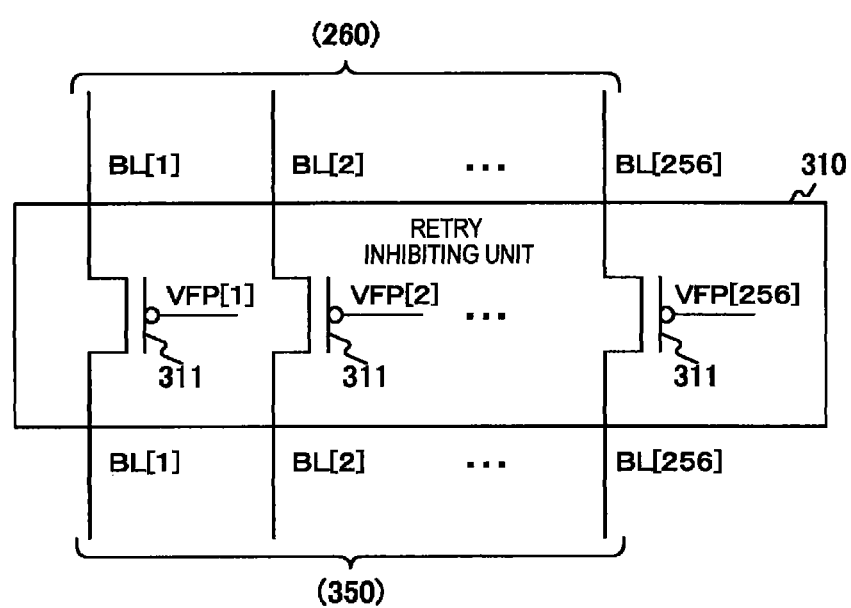
FIG. 6 is a block diagram illustrating an exemplary configuration of a retry inhibiting unit according to the first embodiment.

FIG. 6 is a block diagram illustrating an exemplary configuration of the retry inhibiting unit 310 according to the first embodiment. The retry inhibiting unit 310 includes an inhibition control transistor 311 for each bit line BL.

The inhibition control transistor 311 inhibits the retry process from being performed on a memory cell in which setting or resetting has been successfully performed. For example, a pMOS transistor may be used as the inhibition control transistor 311. The inhibition control transistor 311 is inserted into the bit line BL[k], and receives the verification result VFP[k] through a gate electrode. When the value of the verification result VFP[k] is "0," the inhibition control transistor 311 is in an ON state, and the write driver unit 350 can perform setting or resetting through the bit line BL[k]. However, when the value of the verification result VFP[k] is "1," that is, when rewriting has been successfully performed, the inhibition control transistor 311 is in an OFF state, and supply of data from the write driver unit 350 through the bit line BL[k] is blocked. As a result, the retry process is inhibited.

Exemplary Configuration of Verifying Unit

Figure 7:
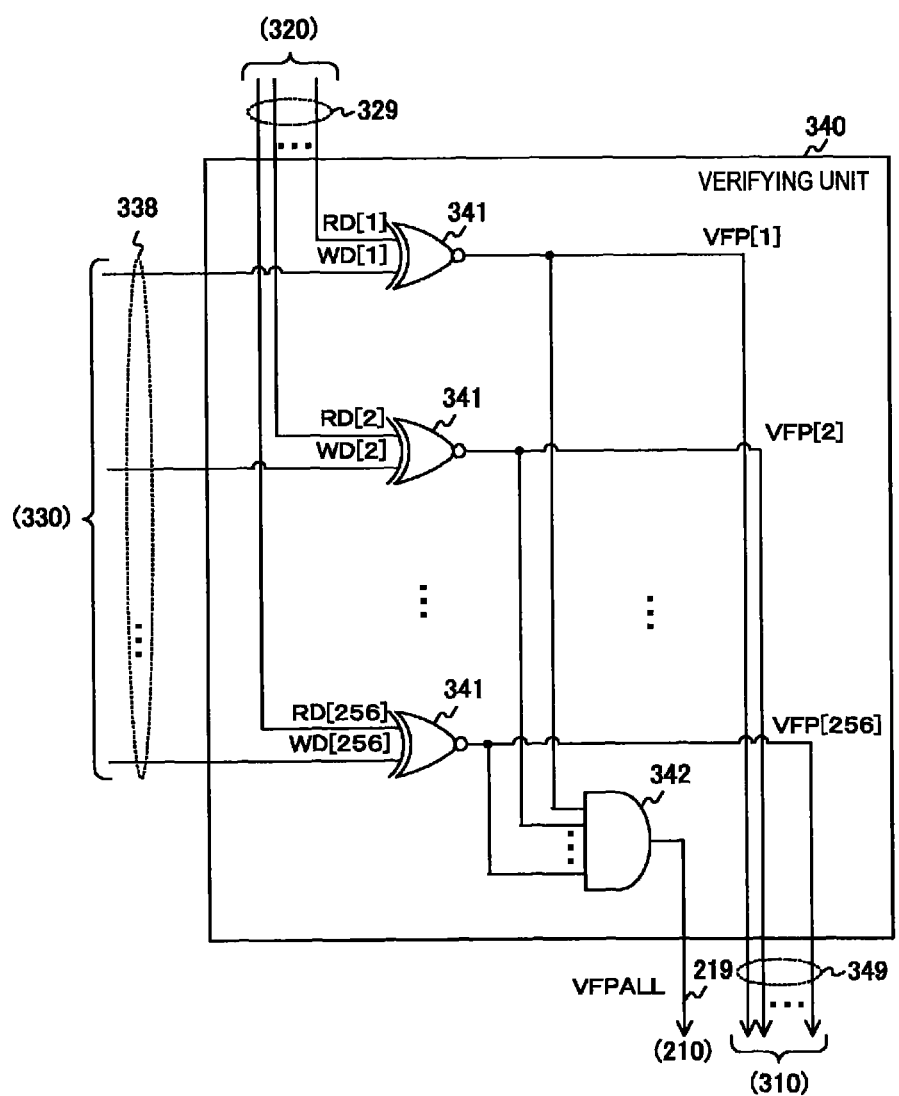
FIG. 7 is a block diagram illustrating an exemplary configuration of a verifying unit according to the first embodiment.

FIG. 7 is a block diagram illustrating an exemplary configuration of the verifying unit 340 according to the first embodiment. The verifying unit 340 includes NOR (exclusive OR) gates 341 which are equal in number to the number (for example, 256) of rows of the memory cell array 260 and one AND (logical product) gate 342.

The NOR gate 341 outputs an exclusive logical sum of input values. The NOR gate 341 includes two input terminals, read data RD[k] from the data input/output circuit 230 is input to one of the input terminals, and the write data WD[k] from the driver control unit 330 is input to the other terminal. The NOR gate 341 supplies the exclusive logical sum of the input values to the retry inhibiting unit 310 and the AND gate 342 as the verification result VFP[k].

The AND gate 342 outputs a logical product of input values. The verification results VFP[1] to VFP[256] are input to the AND gate 342. The AND gate 342 supplies the logical product of the input values to the rewrite control unit 210 as the verification result VFPALL.

Exemplary Configuration of Write Driver Unit

Figure 8:
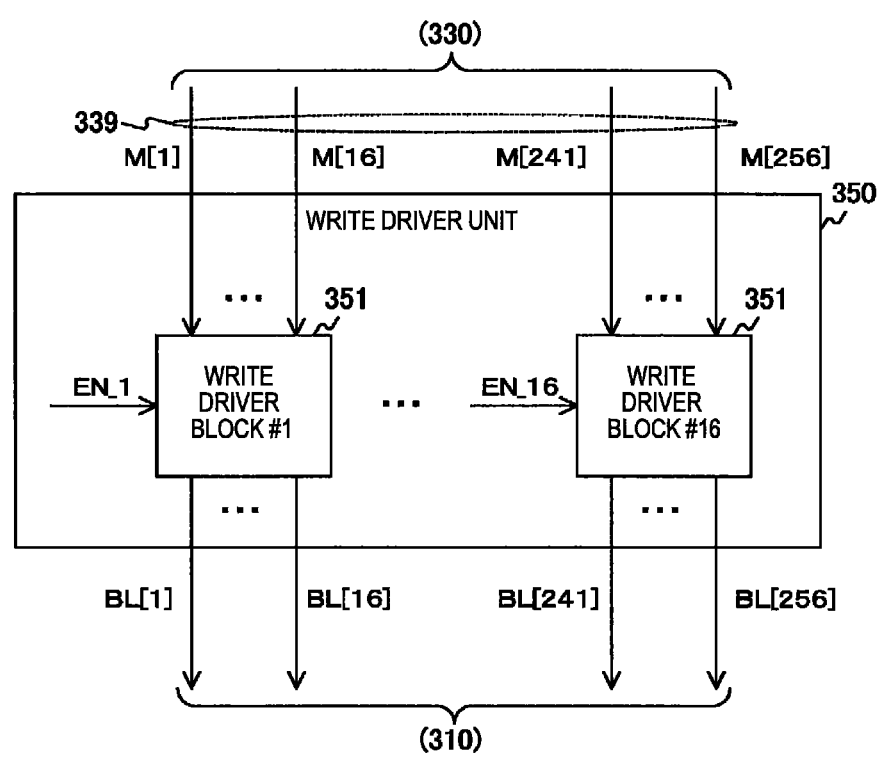
FIG. 8 is a block diagram illustrating an exemplary configuration of a write driver unit according to the first embodiment.

FIG. 8 is a block diagram illustrating an exemplary configuration of the write driver unit 350 according to the first embodiment. The write driver block 351 includes write drivers which are equal in number to the number of columns of the memory cells. The write driver is divided into a plurality of write driver blocks 351 in data write units. For example, when the number of columns of the memory cells, that is, the number of write drivers, is 256 and the data write unit is 16 bits, the write driver is divided into write driver blocks #1 to #16.

Each of the write driver blocks 351 receives 16-bit mask data (reset mask data or set mask data), and is connected to 16 bit lines BL. Further, the enable signal EN_K is input to the write driver block #K.

Exemplary Configuration of Write Driver Block

Figure 9:
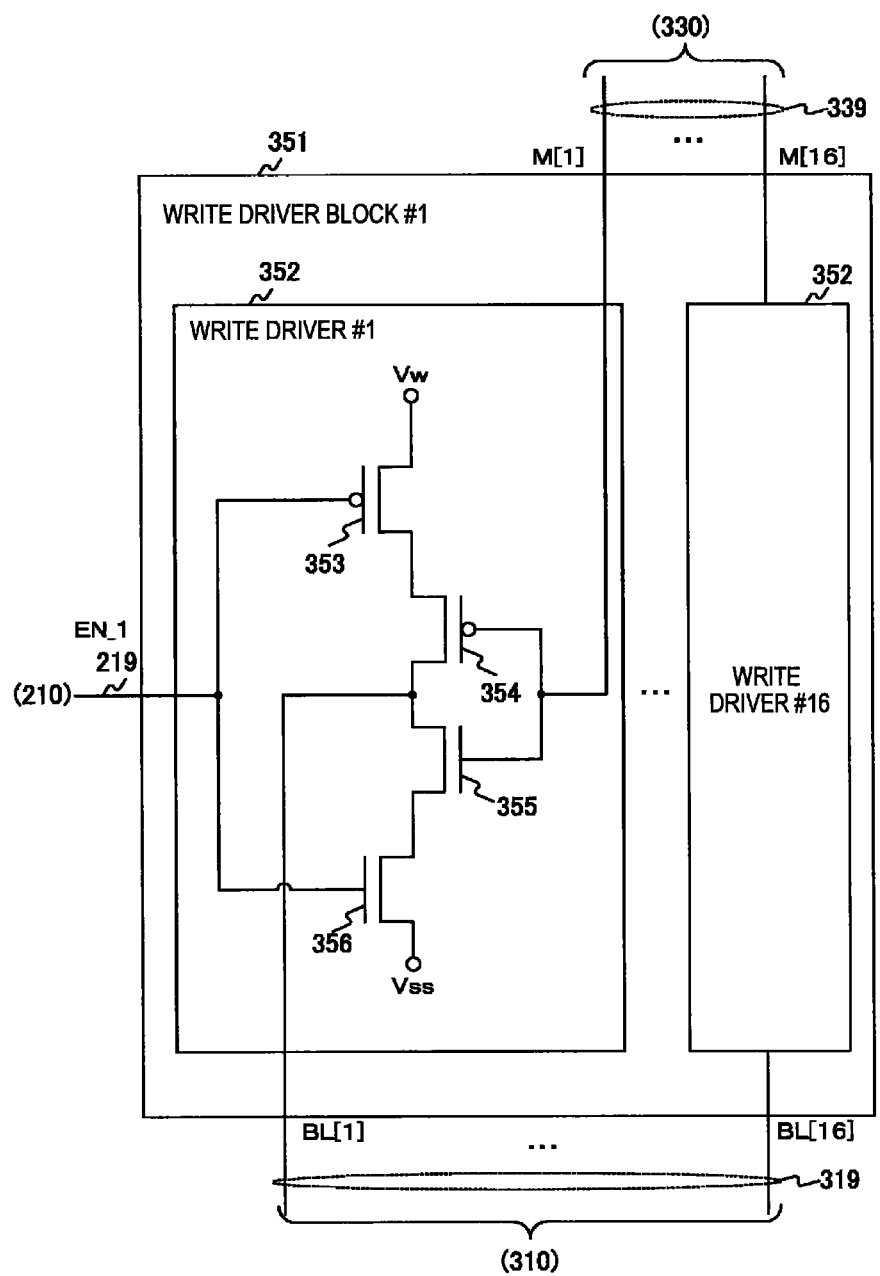
FIG. 9 is a block diagram illustrating an exemplary configuration of a write driver block according to the first embodiment.

FIG. 9 is a block diagram illustrating an exemplary configuration of the write driver block 351 according to the first embodiment. The write driver block 351 includes write drivers 352 which are equal in number to the number of bits (for example, "16") corresponding to the data write units.

The write driver 352 sets or resets a memory cell according to the mask data and the enable signal. The write driver 352 includes rewrite control transistors 353, 354, 355, and 356.

The rewrite control transistor 353 supplies an electric current used to reset a memory cell to the bit line BL according to the enable signal. The rewrite control transistor 356 supplies an electric current used to set a memory cell to the bit line BL according to the enable signal. Further, the rewrite control transistor 354 supplies an electric current used to reset a memory cell to the bit line BL according to the mask data. The rewrite control transistor 355 supplies an electric current used to set a memory cell to the bit line BL according to the mask data.

For example, pMOS transistors may be used as the rewrite control transistors 353 and 354, and nMOS transistors may be used as the rewrite control transistor 355 and 356.

A write voltage Vw is applied to a source electrode of the rewrite control transistor 353, a drain electrode is connected to the rewrite control transistor 354, and the enable signal is input to a gate electrode. A source electrode of the rewrite control transistor 354 is connected to the rewrite control transistor 353, a drain electrode is connected to the rewrite control transistor 355, and mask data is input to a gate electrode.

Further, a source electrode of the rewrite control transistor 355 is connected to the rewrite control transistor 354, a drain electrode is connected to the rewrite control transistor 356, and mask data is input to a gate electrode. A source electrode of the rewrite control transistor 356 is connected to the rewrite control transistor 355, a reference voltage Vss is applied to a drain electrode, and an enable signal is input to a gate electrode. Here, the write voltage Vw is a voltage higher than the reference voltage Vss.

Through this configuration, when the enable signal and the mask data have the low level, the rewrite control transistors 353 and 354 are turned on. As a result, the write voltage Vw is applied to the bit line BL, and the memory cell connected to the bit line BL is reset. Meanwhile, when the enable signal and the mask data have the high level, the rewrite control transistors 355 and 356 are turned on. As a result, the reference voltage Vss is applied to the bit line BL, and the memory cell connected to the bit line BL is set.

Exemplary Functional Configuration of Memory Control Unit

Figure 10:
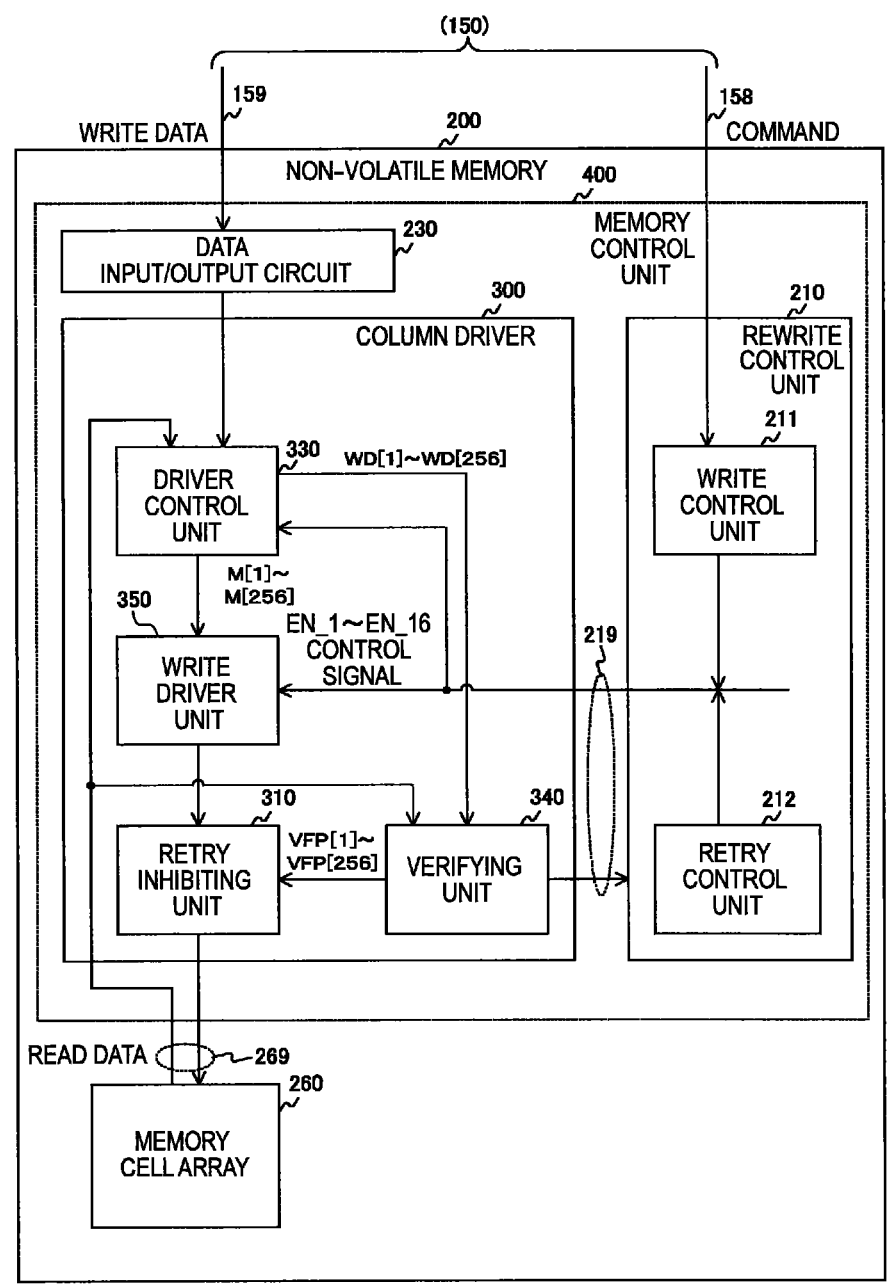
FIG. 10 is a block diagram illustrating an exemplary functional configuration of a non-volatile memory according to the first embodiment.

FIG. 10 is a block diagram illustrating an exemplary functional configuration of the non-volatile memory 200 according to the first embodiment. The non-volatile memory 200 has the functions of the data input/output circuit 230, the column driver 300, the rewrite control unit 210, and the memory cell array 260. The rewrite control unit 210 further has functions of the write control unit 211 and the retry control unit 212. The column driver 300 has the functions of the retry inhibiting unit 310, the driver control unit 330, the verifying unit 340, and the write driver unit 350.

The write control unit 211 sequentially designates the memory blocks #1 to #16, and causes write data to be written in the write driver unit 350. The write control unit 211 receives a command from the memory controller 150. When the command is the write command, the write control unit 211 instructs the driver control unit 330 and the write driver unit 350 to perform resetting according to the control signal. Further, the write control unit 211 sequentially designates the memory blocks #1 to #16 according to the enable signals EN_1 to EN_16.

When the reset instruction is given according to the control signal, the driver control unit 330 reads pre-read data from the memory cell array 260, reads write data from the data input/output circuit 230, and compares the pre-read data with the write data in units of bits. The driver control unit 330 generates the reset mask data RM[1] to RM[256] based on the comparison result, and supplies the reset mask data RM[1] to RM[256] to the write driver unit 350.

Further, when all the memory blocks are reset by the enable signals EN_1 to EN_16, the driver control unit 330 generates the write data WD[1] to WD[256] in which a bit corresponding to a bit set in the pre-read data is set. The driver control unit 330 supplies the write data to the verifying unit 340.

When the set instruction is given according to the control signal, the write driver unit 350 sequentially accesses the memory blocks #1 to #16 according to the enable signals EN_1 to EN_16, and resets the memory cell of the reset target represented by the reset mask data.

Upon receiving write data from the driver control unit 330, the verifying unit 340 reads verification read data from the memory cell array 260. The verifying unit 340 compares the write data with the verification read data in units of bits. The verifying unit 340 generates the verification results VFP[1] to VFP[256] based on the comparison result made in units of bits, and supplies the verification results VFP[1] to VFP[256] to the retry inhibiting unit 310.

Further, the verifying unit 340 generates a signal representing whether or not the write data and the verification read data match in all bits as the verification result VFPALL, and supplies the verification result VFPALL to the retry control unit 212.

The retry inhibiting unit 310 inhibits resetting from being performed again in a memory cell in which resetting has been successfully performed.

When the write data and the verification read data do not match in any one bit, the retry control unit 212 designates the memory blocks #1 to #16, and simultaneously executes the retry process. When the write data and the verification read data do not match in any one bit, the retry control unit 212 instructs the driver control unit 330 and the write driver unit 350 to perform resetting through the control signal. Further, the retry control unit 212 collectively designates the memory blocks #1 to #16 according to the enable signals EN_1 to EN_16.

Then, the driver control unit 330 supplies the reset mask data RM[1] to RM[256] to the write driver unit 350 again, and supplies WD[1] to WD[256] to the verifying unit 340.

The write driver unit 350 collectively resets the memory blocks #1 to #16 again according to the enable signals EN_1 to EN_16. The verifying unit 340 supplies the verification results VFP[1] to VFP[256] to the retry inhibiting unit 310, and supplies the verification result VFPALL to the retry control unit 212.

Further, when the write data and the verification read data match in all bits, the write control unit 211 gives the set instruction through the control signal, and sequentially designates the memory blocks #1 to #16 through the enable signals EN_1 to EN_16. The driver control unit 330, the write driver unit 350, the verifying unit 340, the retry inhibiting unit 310, and the retry control unit 212 operate in a manner similar to the time of setting. As a result, the write data is written in the memory cell array 260.

As the retry process is performed collectively on all the memory blocks as described above, compared to when the retry process is performed sequentially, a time of the retry process is reduced, and the throughput is improved. In addition, since the retry inhibiting unit 310 inhibits the retry process from being performed in a memory cell in which resetting has been successfully performed, even when the retry process is executed collectively on the memory block, a possibility that more bits than in the write unit will be reset is low.

Figure 11:
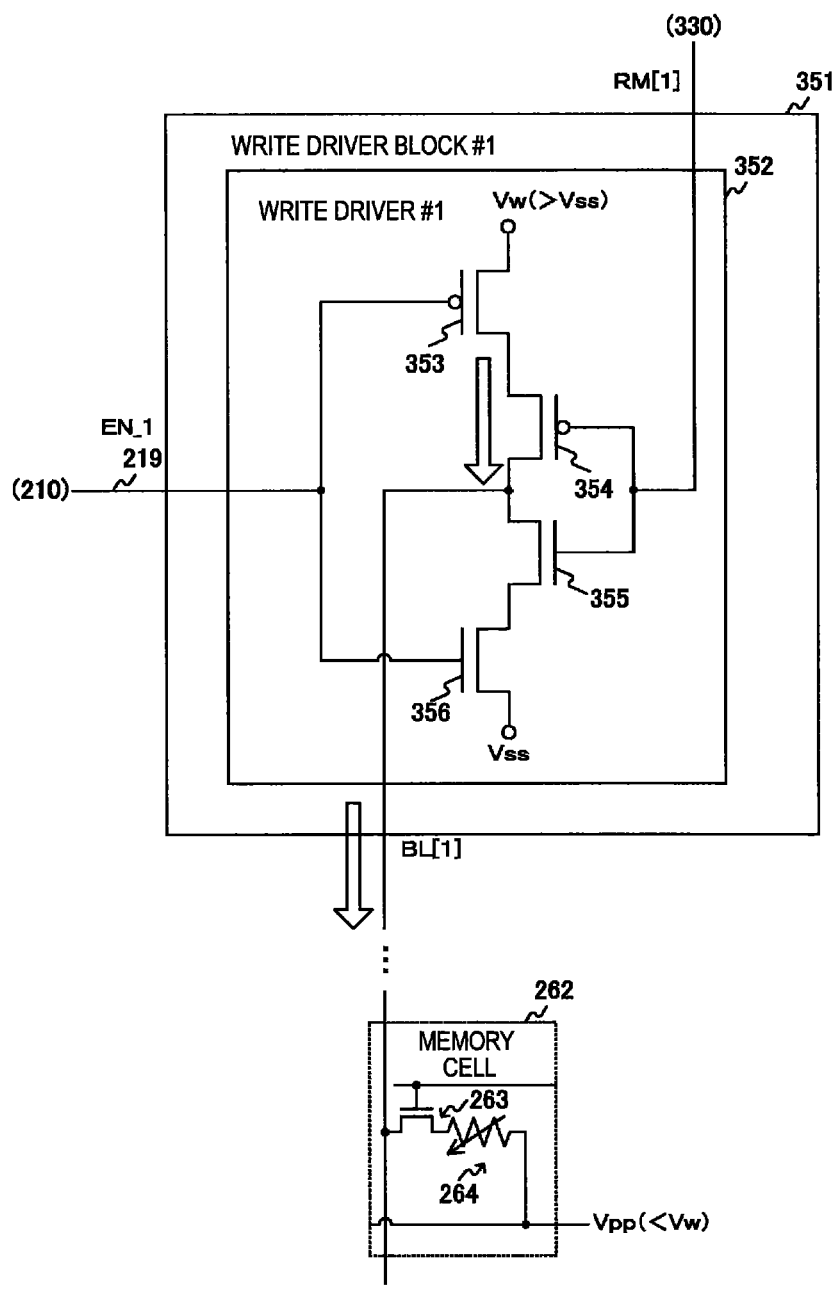
FIG. 11 is a diagram illustrating an example of a voltage applied to a memory cell at the time of resetting according to the first embodiment.

FIG. 11 is a diagram illustrating an example of a voltage applied to the memory cell 262 at the time of resetting according to the first embodiment. When the enable signal EN_1 and the reset mask data RM[1] have the low level, the rewrite control transistors 353 and 354 in the write driver #1 are in the ON state. As a result, the write voltage Vw is applied to the memory cell 262 through the bit line BL[1]. Since the write voltage Vw is a voltage higher than the plate voltage Vpp by a predetermined voltage or more, an electric current flows from the write driver #1 to the memory cell 262, and the memory cell 262 is rewritten to "1" and reset. In other words, when an instruction to reset all the write driver blocks 351 is given through the enable signal EN_1 and a bit of a reset target is indicated by the reset mask data RM[1], the corresponding bit is reset.

Meanwhile, when the enable signal EN_1 or the reset mask data RM[1] has the high level, the rewrite control transistor 353 or 354 in the write driver #1 is in the OFF state. As a result, the write voltage Vw higher than the plate voltage Vpp by a predetermined voltage or more is not applied, and the memory cell 262 of the access destination of the bit line BL[1] is not rewritten.

Figure 12:
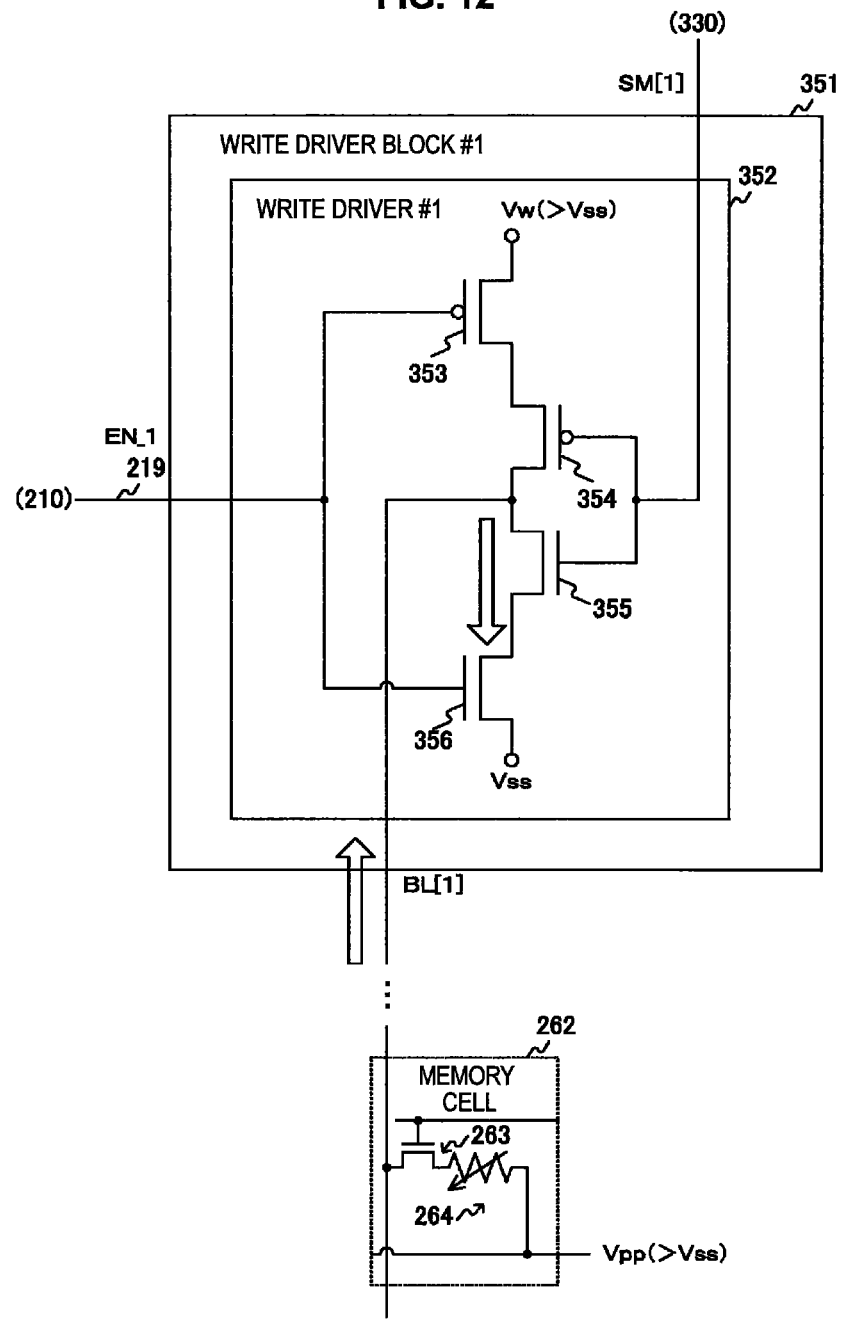
FIG. 12 is a diagram illustrating an example of a voltage applied to a memory cell at the time of setting according to the first embodiment.

FIG. 12 is a diagram illustrating an example of a voltage applied to the memory cell 262 at the time of setting according to the first embodiment. When the enable signal EN_1 and the set mask data SM[1] have the high level, the rewrite control transistors 355 and 356 in the write driver #1 are in the ON state. As a result, the reference voltage Vss is applied to the memory cell 262 through the bit line BL[1]. Since the reference voltage Vss is a voltage lower than the plate voltage Vpp by a predetermined voltage or more, an electric current flows from the memory cell 262 to the write driver #1, and the memory cell 262 is rewritten to "0" and set. In other words, when an instruction to set all the write driver blocks 351 is given through the enable signal EN_1 and a bit of a set target is indicated by the set mask data SM[1], the corresponding bit is set.

Meanwhile, when the enable signal EN_1 or the set mask data SM[1] has the low level, the rewrite control transistor 355 or 356 in the write driver #1 becomes the OFF state. As a result, the reference voltage Vss lower than the plate voltage Vpp by a predetermined voltage or more, is not applied, and the memory cell 262 of the access destination of the bit line BL[1] is not rewritten.

Exemplary Operation of Non-Volatile Memory

Figure 13:
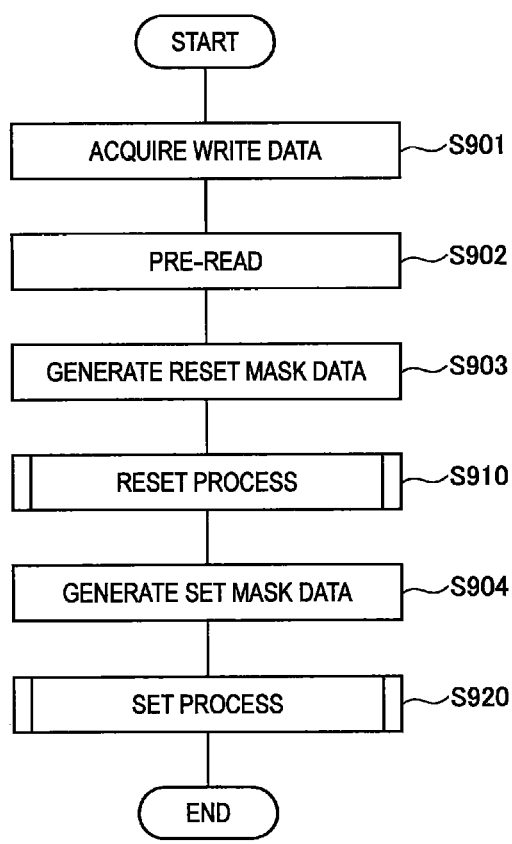
FIG. 13 is a flowchart illustrating an example of a write process according to the first embodiment.

FIG. 13 is a flowchart illustrating an example of the write process according to the first embodiment. The operation starts when the write command is input to the non-volatile memory 200. The non-volatile memory 200 acquires write data from the memory controller 150 and holds the write data (step S901). The non-volatile memory 200 reads data written at a designated address by the write command as pre-read data (step S902). The non-volatile memory 200 compares the write data with the pre-read data in units of bits.

Then, the non-volatile memory 200 generates reset mask data based on the comparison result (step S903). The non-volatile memory 200 executes the reset process based on the reset mask data (step S910). Next, the non-volatile memory 200 generates set mask data based on the comparison result of the write data and the pre-read data (step S904). The non-volatile memory 200 executes the set process based on the set mask data (step S920). After step S920, the non-volatile memory 200 ends the write process.

Figure 14:
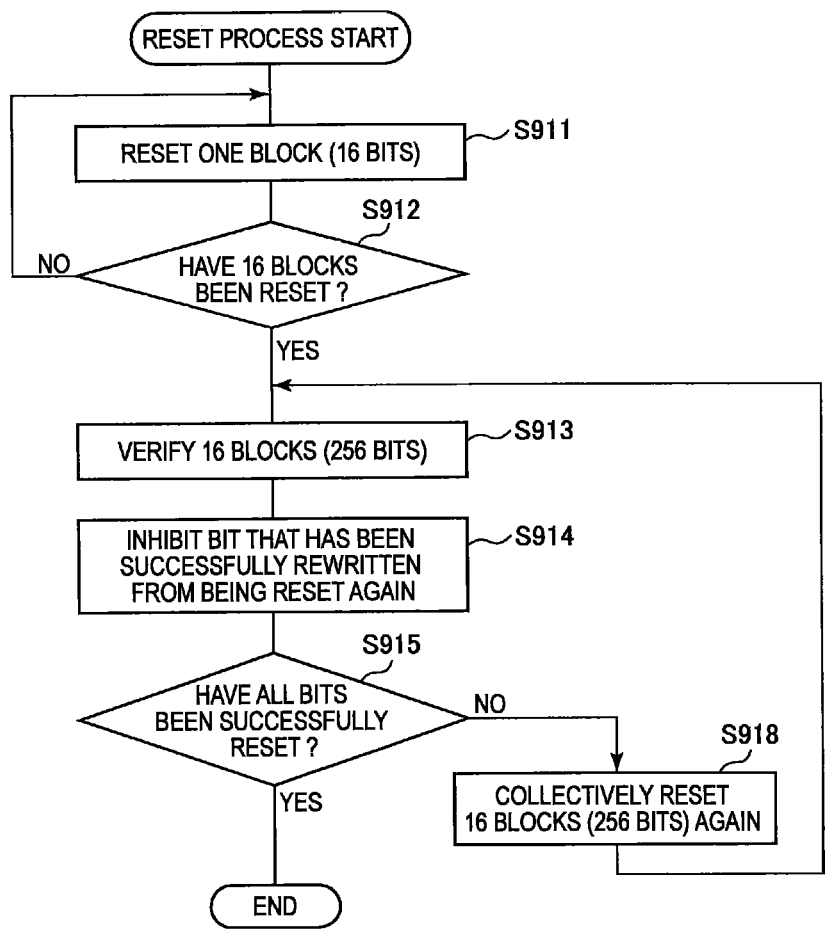
FIG. 14 is a flowchart illustrating an example of a reset process according to the first embodiment.

FIG. 14 is a flowchart illustrating an example of the reset process according to the first embodiment. The non-volatile memory 200 causes one of the enable signals EN_1 to EN_16 to transition to the low level, and resets one of the memory blocks #1 to #16 (step S911). The non-volatile memory 200 determines whether or not all 16 blocks have been reset (step S912). When any one of all blocks has not been reset (No in step S912), the non-volatile memory 200 causes the process to return to step S911.

When all blocks have been reset (Yes in step S912), the non-volatile memory 200 compares the write data with the verification read data in units of bits in the memory blocks #1 to #16. The non-volatile memory 200 verifies whether or not rewriting has been successfully performed for each bit based on the comparison result (step S913). The non-volatile memory 200 inhibits a bit that has been successfully rewritten from being reset again (step S914).

The non-volatile memory 200 determines whether or not all bits of the reset target have been successfully rewritten (step S915). When any one of bits of the reset target has not been successfully rewritten (No in step S915), the non-volatile memory 200 causes the enable signals EN_1 to EN_16 to transition to the low level. As a result, the memory blocks #1 to #16 are collectively reset again (step S918). After step S918, the non-volatile memory 200 causes the process to return to step S913.

Meanwhile, when all bits of the reset target have been successfully rewritten (Yes in step S915), the non-volatile memory 200 ends the reset process.

Figure 15:
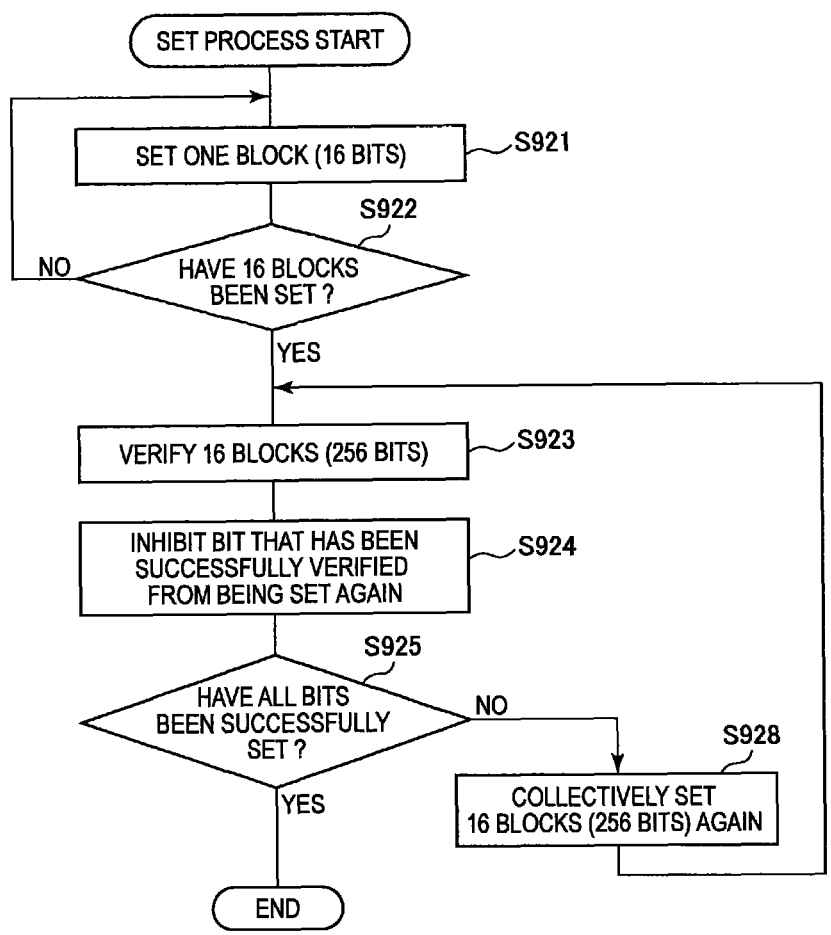
FIG. 15 is a flowchart illustrating an example of a set process according to the first embodiment.

FIG. 15 is a flowchart illustrating an example of the set process according to the first embodiment. The non-volatile memory 200 causes one of the enable signals EN_1 to EN_16 to transition to the high level, and sets one of the memory blocks #1 to #16 (step S921). The non-volatile memory 200 determines whether or not all 16 blocks have been set (step S922). When any one of all blocks has not been set (No in step S922), the non-volatile memory 200 causes the process to return to step S921.

When all blocks have been set (Yes in step S922), the non-volatile memory 200 compares the write data with the verification read data in units of bits in the memory blocks #1 to #16. The non-volatile memory 200 verifies whether or not rewriting has been successfully performed for each bit based on the comparison result (step S923). The non-volatile memory 200 inhibits a bit that has been successfully rewritten from being set again (step S924).

The non-volatile memory 200 determines whether or not all bits of the set target have been successfully rewritten (step S925). When all bits of the set target have been successfully rewritten (No in step S925), the non-volatile memory 200 causes the enable signals EN_1 to EN_16 to transition to the high level. As a result, the memory blocks #1 to #16 are collectively set again (step S928). After step S928, the non-volatile memory 200 causes the process to return to step S923.

Meanwhile, when all bits of the set target have been successfully rewritten (Yes in step S925), the non-volatile memory 200 ends the set process.

Figure 16:
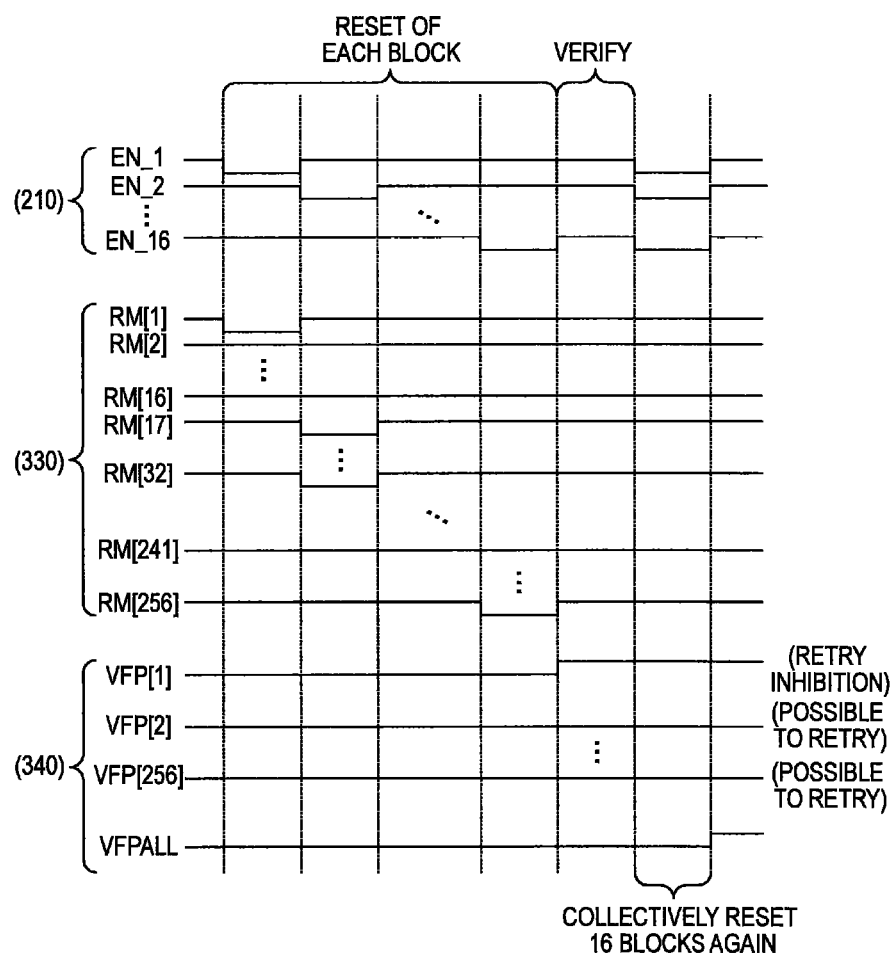
FIG. 16 is a timing chart illustrating an example of an operation of a non-volatile memory at the time of resetting according to the first embodiment.

FIG. 16 is a timing chart illustrating an example of an operation of the non-volatile memory 200 at the time of resetting according to the first embodiment. The rewrite control unit 210 in the non-volatile memory 200 causes the enable signals EN_1 to EN_16 to sequentially have the low level during a predetermined period of time. As a result, the memory blocks #1 to #16 are sequentially reset.

The driver control unit 330 in the non-volatile memory 200 generates the reset mask data RM[1] to RM[256] in which the bit of the reset target has the low level. As a result, the memory cell of the reset target is reset.

When all the memory blocks are reset, the verifying unit 340 in the non-volatile memory 200 verifies whether or not resetting has been successfully performed for all bits, and generates the verification results VFP[1] to VFP[256] in which the bit that has been successfully reset has the high level. As a result, resetting is inhibited from being performed again on the memory cell on which resetting has been successfully performed. Further, the verifying unit 340 generates the verification result VFPALL representing whether or not all bits of the reset target have been successfully reset.

When the verification result VFPALL has the low level, that is, when any one of bits of the reset target has not been successfully reset, the rewrite control unit 210 causes the enable signals EN_1 to EN_16 to simultaneously transition to the low level. As a result, the memory blocks #1 to #16 are collectively reset again.

Figure 17:
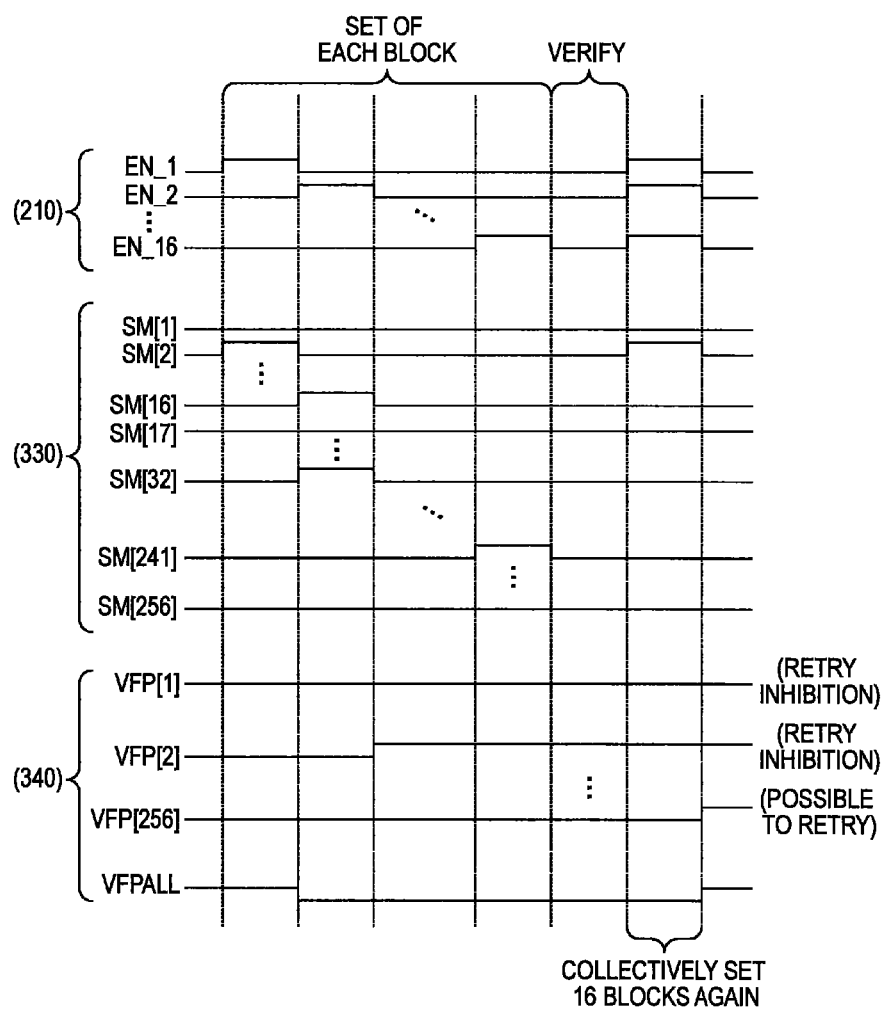
FIG. 17 is a timing chart illustrating an example of an operation of a non-volatile memory at the time of setting according to the first embodiment.

FIG. 17 is a timing chart illustrating an example of an operation of the non-volatile memory 200 at the time of setting according to the first embodiment. The rewrite control unit 210 in the non-volatile memory 200 causes the enable signals EN_1 to EN_16 to sequentially transition to the high level during a predetermined period of time. As a result, the memory blocks #1 to #16 are sequentially set.

The driver control unit 330 in the non-volatile memory 200 generates the set mask data SM[1] to SM[256] in which the bit of the set target has the high level. As a result, the memory cell of the set target is set.

When all the memory blocks are reset, the verifying unit 340 in the non-volatile memory 200 verifies whether or not setting has been successfully performed for all bits, and generates the verification result VFP[1] to VFP[256] in which the bits that have been successfully set have the high level. As a result, setting is inhibited from being performed again on the memory cell on which setting has been successfully performed. Further, the verifying unit 340 generates the verification result VFPALL representing whether or not all bits of the set target have been successfully set.

When the verification result VFPALL has the low level, that is, when any one of bits of the set target has not been successfully set, the rewrite control unit 210 causes the enable signals EN_1 to EN_16 to simultaneously transition to the high level. As a result, the memory blocks #1 to #16 are collectively set again.

As described above, according to the first embodiment, when write data is written again, the memory control unit 400 designates a predetermined number of memory blocks and simultaneously writes write data, and thus the throughput is improved compared to when writing is sequentially performed when writing is performed again. Further, writing is inhibited from being performed again on bits that have been successfully written, and a failure probability of writing is lowered, and thus the number of bits that have been actually written when writing is performed again is small. Thus, a probability that more bits than in the write unit will be written is low.

Modified Example

The first embodiment has been described in connection with the example in which the memory control unit 400 is configured to collectively perform the retry on all the memory blocks, but the retry may be performed collectively on some of the memory blocks. This is because, when there are many memory cells in the memory cell array 260 on which writing is performed, it may be difficult to perform the retry collectively on all the memory cells. For example, an example in which the memory cell array 260 has twice (512 bits) as many memory cells as in the configuration illustrated in the first embodiment, the memory cells are divided into 32 memory blocks in units of 16 bits, and data is written is considered. If a failure probability of writing is assumed to be equal to that in the first embodiment, when the retry is performed collectively on the 32 memory blocks, more bits than in the write unit are likely to be written. In this case, the memory control unit 400 may perform the retry collectively for every 16 memory blocks. The memory control unit 400 according to a modified example is different from that according to the first embodiment in that some of memory blocks are designated and subjected to the retry process.

Figure 18:
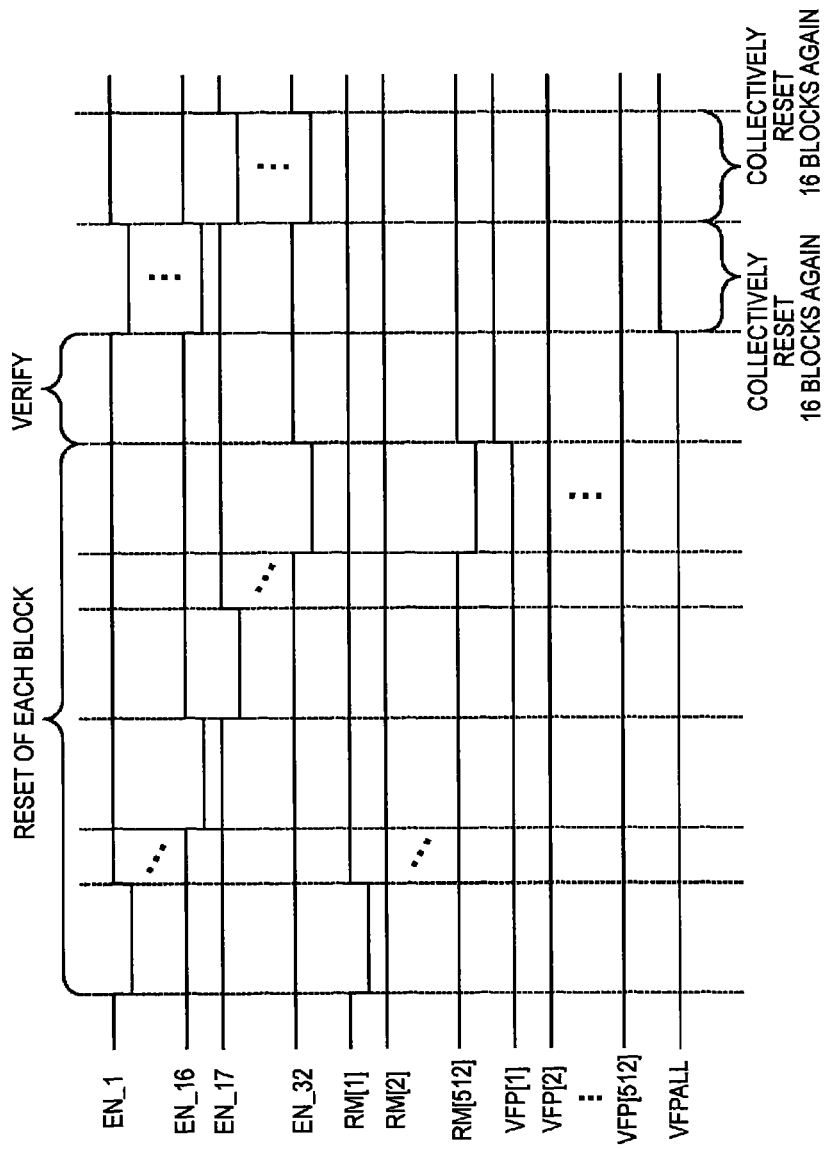
FIG. 18 is a timing chart illustrating an example of an operation of a non-volatile memory at the time of resetting according to a modified example of the first embodiment.

FIG. 18 is a timing chart illustrating an example of an operation of the non-volatile memory 200 at the time of resetting according to the modified example of the first embodiment. The rewrite control unit 210 causes the enable signal EN_1 to EN_32 to sequentially transition to the low level during a predetermined period of time, and sequentially resets 32 memory blocks.

The driver control unit 330 generates reset mask data RM[1] to RM[512] in which the bit of the reset target has the low level. As a result, the memory cell of the reset target is reset.

When the 32 memory blocks are reset, the verifying unit 340 verifies whether or not resetting has been successfully performed, and generates verification results VFP[1] to VFP [512] in which the bits that have been successfully reset have the high level. Further, the verifying unit 340 generates a verification result VFPALL representing whether or not all bits of the reset target have been successfully reset.

When the verification result VFPALL has the low level, that is, when any one of bits of the reset target has not been successfully reset, the rewrite control unit 210 causes the enable signals EN_1 to EN_16 to simultaneously transition to the low level, and thus 16 of the 32 memory blocks are collectively reset again. Thereafter, the rewrite control unit 210 causes the enable signals EN_17 to EN_32 to simultaneously transition to the low level, and collectively resets the remaining memory blocks again. Similarly, in the set process, some of memory blocks are collectively set.

As described above, according to the modified example, the throughput can be improved regardless of the number of memory cells of the memory cell array 260.

2. Second Embodiment

Exemplary Configuration of Column Driver

Figure 19:
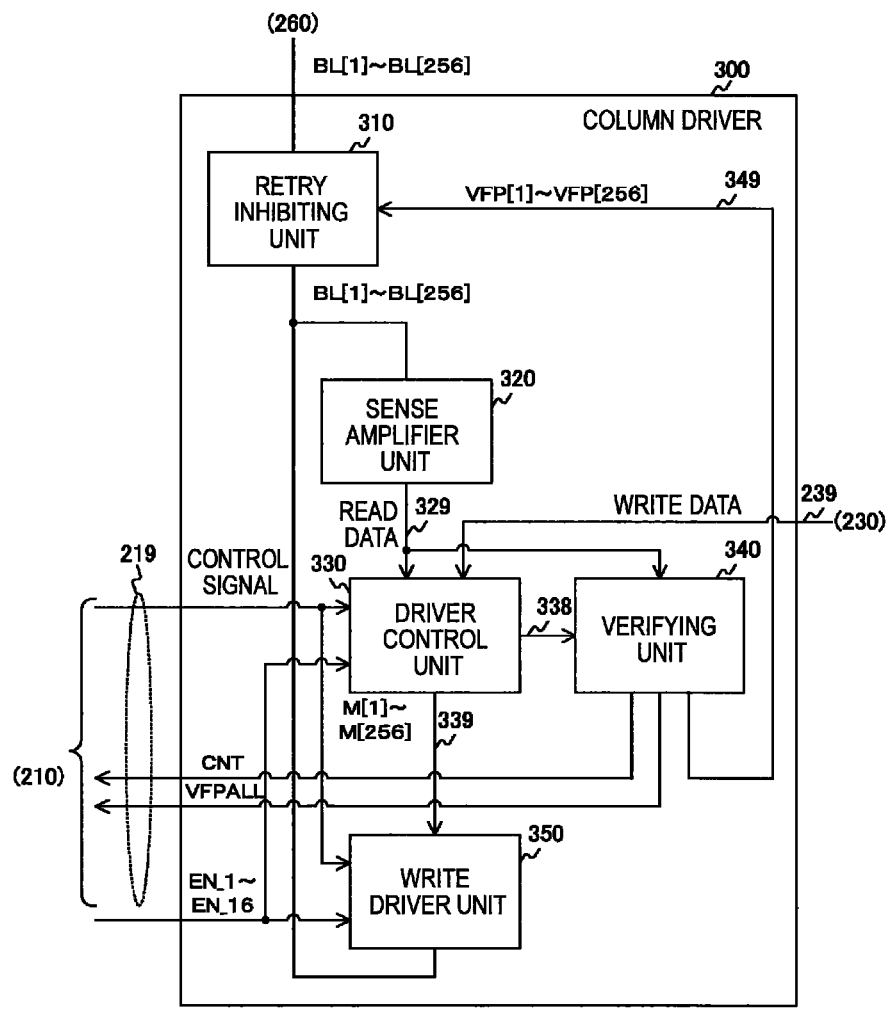
FIG. 19 is a block diagram illustrating an exemplary configuration of a column driver according to a second embodiment.

FIG. 19 is a block diagram illustrating an exemplary configuration of the column driver 300 according to a second embodiment. In the first embodiment, under the assumption that the number of bits that fail to be written is less than in the write unit, write data is collectively written in a predetermined number of memory blocks in the retry process. However, when a failure probability of writing is relatively high, the number of bits that fail to be written may be the write unit or more. Unlike the first embodiment, the non-volatile memory 200 according to the second embodiment counts the number of bits that have failed to be written, and only when the number of counted bits is less than a predetermined threshold value, write data is collectively written in a predetermined number of memory blocks.

In the column driver 300 according to the second embodiment, the verifying unit 340 counts the number of bits that have failed to be written. The verifying unit 340 supplies the count value to the rewrite control unit 210 as a failure bit number CNT. The rewrite control unit 210 according to the second embodiment gives an instruction so that the retry process is executed collectively on a predetermined number of memory blocks when the failure bit number CNT is less than the write unit. Meanwhile, when the failure bit number CNT is not less than the threshold value, the rewrite control unit 210 gives an instruction so that the retry process is sequentially executed on the memory blocks #1 to #16. Here, the threshold value is set to a value (for example, "16") of the number of bits allowed to be rewritten at a time.

Exemplary Configuration of Verifying Unit

Figure 20:
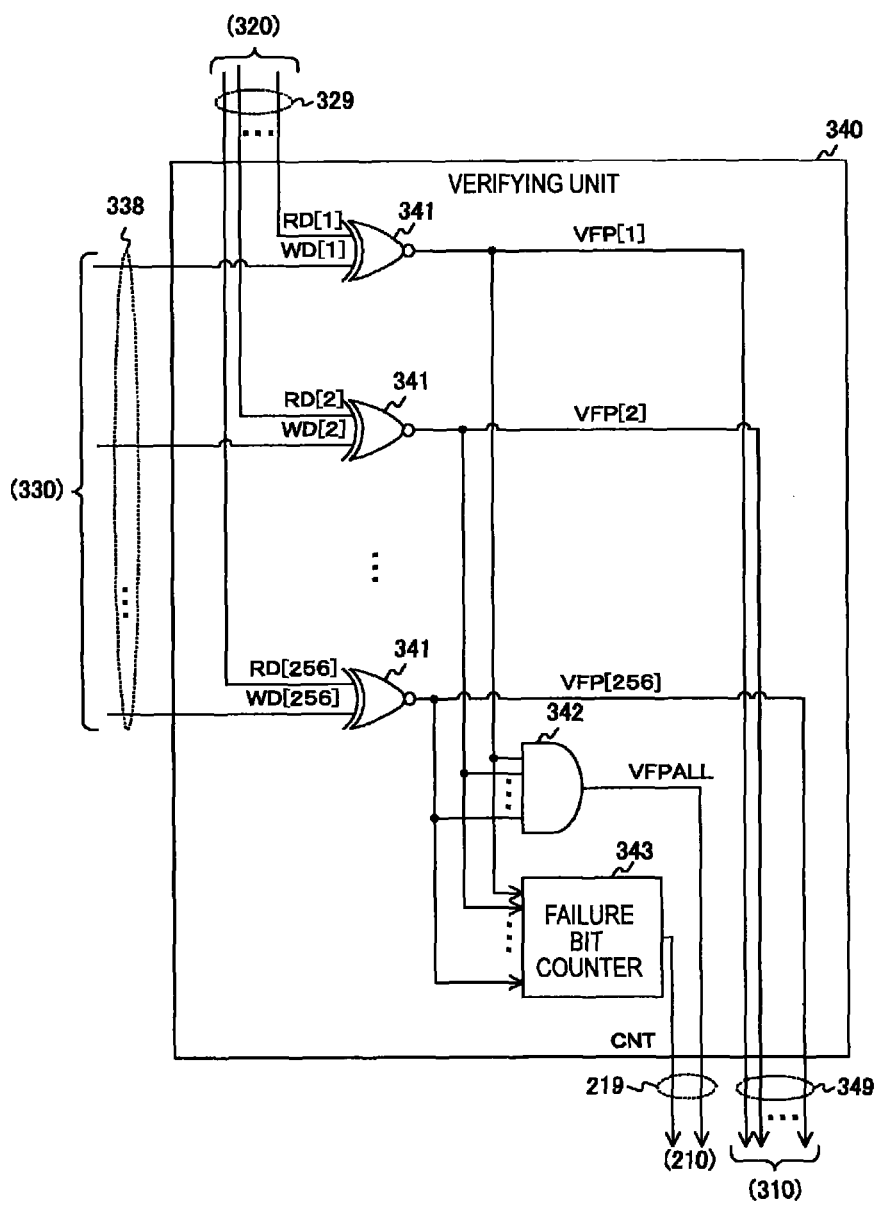
FIG. 20 is a block diagram illustrating an exemplary configuration of a verifying unit according to the second embodiment.

FIG. 20 is a block diagram illustrating an exemplary configuration of the verifying unit 340 according to the second embodiment. The verifying unit 340 according to the second embodiment further includes a failure bit counter 343. The NOR gate 341 further supplies the verification results VFP[1] to VFP[256] to the failure bit counter 343.

The failure bit counter 343 counts the number of bits that have failed to be written. The failure bit counter 343 counts the number of values of "0" among the verification results VFP[1] to VFP[256], and supplies the count value to the rewrite control unit 210 as the failure bit number CNT.

Exemplary Operation of Non-Volatile Memory

FIG. 21 is a flowchart illustrating an example of the reset process according to the second embodiment. The reset process according to the second embodiment is different from that according to the first embodiment in that steps S916, S917, and S919 are further executed. When any one of all bits of the reset target has not been successfully rewritten (No in step S915), the non-volatile memory 200 counts the number of bits that have failed to be written (step S916). Then, the non-volatile memory 200 determines whether or not the failure bit number CNT is less than a threshold value (step S917).

When the failure bit number CNT is less than the threshold value (Yes in step S917), the non-volatile memory 200 collectively resets the memory blocks #1 to #16 (step S918). However, when the failure bit number CNT is not less than the threshold value (No in step S917), the non-volatile memory 200 resets the memory blocks #1 to #16 again for each block (step S919). After step S918 or S919, the non-volatile memory 200 causes the process to return to step S913.

FIG. 22 is a flowchart illustrating an example of the set process according to the second embodiment. The set process according to the second embodiment is different from that according to the first embodiment in that steps S926, S927, and S929 are further executed. When any one of all bits of the set target has not been successfully rewritten (No in step S925), the non-volatile memory 200 counts the number of bits that have failed to be written (step S926). Then, the non-volatile memory 200 determines whether or not the failure bit number CNT is less than a threshold value (step S927).

When the failure bit number CNT is less than the threshold value (Yes in step S927), the non-volatile memory 200 collectively sets the memory blocks #1 to #16 again (step S928). However, when the failure bit number CNT is not less than the threshold value (No in step S927), the non-volatile memory 200 sets the memory blocks #1 to #16 again for each block (step S929). After step S928 or S929, the non-volatile memory 200 causes the process to return to step S923.

As described above, according to the second embodiment of the present technology, the non-volatile memory 200 can collectively write write data in a predetermined number of memory blocks when the failure bit number is less than the threshold value. Thus, it is possible to improve the throughput while suppressing the number of bits to be retried to be less than the threshold value.

The embodiments of the present technology are examples to implement the present technology, and as can be understood in an embodiment of the present technology, matters in the embodiment of the present technology have a correspondence relation with technology specifying matters set forth in the accompanying claims. Similarly, technology specifying matters set forth in the accompanying claims have a correspondence relation with matters in the embodiment of the present technology having the same names, respectively. However, the present technology is not limited to the above embodiments, and various changes can be made within the scope not departing from the gist of the present technology.

Additionally, the present technology may also be configured as below.

(1) A memory control device, including:
a write control unit that sequentially designates a memory block which is a data write unit in a plurality of memory cells;
a write processing unit that writes write data in the designated memory block;
a verifying unit that reads read data from the memory block in which the write data is written, and verifies whether or not the read data matches the write data for each of the plurality of memory cells;
a retry inhibiting unit that inhibits a retry process of writing the write data again from being performed in a memory cell in which the read data matches the write data among the plurality of memory cells; and
a retry control unit that designates at least some memory blocks among the plurality of memory blocks and simultaneously executes the retry process when the read data does not match the write data in any one of the plurality of memory cells in which all the write data is written.

(2) The memory control device according to (1), wherein
the verifying unit verifies whether or not the read data matches the write data, and counts a number of memory cells in which the read data does not match the write data as a failure bit number, and
the retry control unit that designates at least some memory blocks among the plurality of memory blocks and simultaneously executes the retry process when the failure bit number is larger than 1 and the failure bit number is less than a predetermined threshold value.

(3) The memory control device according to (2),
wherein the retry control unit sequentially designates the plurality of memory cells for each of the memory blocks and executes the retry process when the failure bit number is not less than the predetermined threshold value.

(4) The memory control device according to (2) or (3), wherein the predetermined threshold value is a value that does not exceed a number of memory cells in which the write processing unit is allowed to simultaneously write the write data.

(5) The memory control device according to any one of (1) to (4), wherein the write processing unit supplies the write data to each of the memory cells in the designated memory block, and writes the write data, and the retry inhibiting unit blocks supply of the data to a memory cell in which the read data matches the write data, and inhibits execution of the retry process.

(6) The memory control device according to any one of (1) to (5), wherein the retry control unit designates all of the plurality of memory blocks and simultaneously executes the retry process when the read data does not match the write data in any one of the plurality of memory cells in which all the write data is written.

(7) A non-volatile memory, incluing:
 a plurality of memory cells;
 a write control unit that sequentially designates a memory block which is a data write unit in the plurality of memory cells;
 a write processing unit that writes write data in the designated memory block;
 a verifying unit that reads read data from the memory block in which the write data is written, and verifies whether or not the read data matches the write data for each of the plurality of memory cells;
 a retry inhibiting unit that inhibits a retry process of writing the write data again from being performed in a memory cell in which the read data matches the write data among the plurality of memory cells; and
 a retry control unit that designates at least some memory blocks among the plurality of memory blocks and simultaneously executes the retry process when the read data does not match the write data in any one of the plurality of memory cells in which all the write data is written.

(8) A memory control method, including:
 sequentially designating, by a write control unit, a memory block which is a data write unit in a plurality of memory cells;
 writing, by a write processing unit, write data in the designated memory block;
 reading, by a verifying unit, read data from the memory block in which the write data is written, and verifying whether or not the read data matches the write data for each of the plurality of memory cells;
 inhibiting, by a retry inhibiting unit, a retry process of writing the write data again from being performed in a memory cell in which the read data matches the write data among the plurality of memory cells; and
 designating, by a retry control unit, at least some memory blocks among the plurality of memory blocks and simultaneously executing the retry process when the read data does not match the write data in any one of the plurality of memory cells in which all the write data is written.

The present disclosure contains subject matter related to that disclosed in Japanese Priority Patent Application JP 2012-184742 filed in the Japan Patent Office on Aug. 24, 2012, the entire content of which is hereby incorporated by reference.

What is claimed is:

1. A memory control device, comprising:
 a write control unit configured to control writing of write-data to a collection of memory cells by designating write targets in units of memory blocks, where each memory block includes a plurality of the memory cells, and to:
  designate only one memory block at a time as a respective write target while performing an initial-write process for the write-data; and
  designate more than one memory blocks simultaneously as the write targets when performing a write-retry process for the write-data;
 a write driver unit configured to write the write-data by driving bit lines of the memory cells based on the write control unit's designations of the write targets;
 a verifying unit configured to read read-data from the memory cells and to indicate, on a cell-by-cell basis, whether or not the read-data matches the write-data; and
 a retry inhibiting unit configured to inhibit the write-retry process, on a cell-by-cell basis, for those of the memory cells in which the read-data matches the write-data.

2. The memory control device of claim 1,
wherein the retry inhibiting unit includes a switch on the bit line of each of the memory cells that is controlled by the indication from the verifying unit for the respective memory cell.

3. The memory control device of claim 1,
wherein the write control unit is configured to designate all of the memory blocks of the collection of memory cells simultaneously as the write targets when performing the write-retry process for the write-data.

4. The memory control device of claim 1,
wherein the write driver unit is configured such that, when driving the bit lines, only those bit lines of memory blocks that are designated as write-targets are driven.

5. The memory control device of claim 1,
the verifying unit is configured to count a number of the memory cells in which the read data does not match the write data as a failure bit number, and
the write control unit is configured to designate more than one memory block simultaneously as the write targets when performing the write-retry process only when the failure bit number is less than a predetermined threshold value.

6. The memory control device of claim 5,
wherein each of the memory blocks has N corresponding bit lines, and
the predetermined threshold value is less than or equal to N.

7. The memory control device of claim 5,
wherein the write control unit is configured to designate only one memory block at a time as a respective write target when performing the write-retry process for the write-data and when the failure bit number is greater than the predetermined threshold value.

8. The memory control device of claim 1, wherein
the write driver unit is configured to write the write-data by, when a given memory block is designated as one of the write targets, driving all of the bit lines of the given memory block based on the write-data, and
the retry inhibiting unit is configured to inhibit the write process, on a cell-by-cell basis, for those of the memory cells in the given memory block in which the read-data matches the write-data.

9. A non-volatile memory, comprising:
the memory control device of claim 1, and
an array of non-volatile memory cells including the collection of memory cells.

10. A non-volatile memory, comprising:
the memory control device of claim 2, and
an array of non-volatile memory cells including the collection of memory cells.

11. A non-volatile memory, comprising:
the memory control device of claim 3, and
an array of non-volatile memory cells including the collection of memory cells.

12. A non-volatile memory, comprising:
the memory control device of claim 4, and
an array of non-volatile memory cells including the collection of memory cells.

13. A non-volatile memory, comprising:
the memory control device of claim 5, and
an array of non-volatile memory cells including the collection of memory cells.

14. A non-volatile memory, comprising:
the memory control device of claim 6, and
an array of non-volatile memory cells including the collection of memory cells.

15. A non-volatile memory, comprising:
the memory control device of claim 7, and
an array of non-volatile memory cells including the collection of memory cells.

16. A non-volatile memory, comprising:
the memory control device of claim 8, and
an array of non-volatile memory cells including the collection of memory cells.

17. A method, comprising:
controlling writing of write-data to a collection of memory cells by designating write targets in units of memory blocks, where each memory block includes a plurality of the memory cells;
performing an initial-write process for the write-data, in which only one memory block at a time is designated as a respective write target and bit lines of the memory cells are driven based on the designations of write targets;
performing a write-retry process for the write-data, in which more than one memory blocks are simultaneously designated as the write targets and the bit lines of the memory cells are driven based on the designations of write targets;
reading read-data from the memory cells and determining, on a cell-by-cell basis, whether or not the read-data matches the write-data; and
inhibiting the write-retry process, on a cell-by-cell basis, for those of the memory cells in which the read-data matches the write-data.

18. The method of claim 17,
wherein the inhibiting of the write retry process for a given memory cell includes opening a switch on the bit line of the given memory cell.

19. The method of claim 17,
wherein the performing of the write-retry process for the write-data includes designating all of the memory blocks of the collection of memory cells simultaneously as the write targets.

20. The method of claim 17,
wherein in performing the initial-write process and in performing the write-retry process, one of the bit lines is driven for writing the write-data only when the bit line's corresponding memory block is designated as a write target.

\* \* \* \* \*